(12) United States Patent
Chen et al.

(10) Patent No.: US 8,093,722 B2
(45) Date of Patent: *Jan. 10, 2012

(54) SYSTEM-IN-PACKAGE WITH FAN-OUT WLCSP

(75) Inventors: Nan-Cheng Chen, Hsin-Chu (TW); Chih-Tai Hsu, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/905,095

(22) Filed: Oct. 15, 2010

(65) Prior Publication Data

US 2011/0031619 A1  Feb. 10, 2011

Related U.S. Application Data

(63) Continuation-in-part of application No. 12/370,537, filed on Feb. 12, 2009, now Pat. No. 7,838,975.

(60) Provisional application No. 61/056,401, filed on May 27, 2008, provisional application No. 61/347,494, filed on May 24, 2010.

(51) Int. Cl.
  *H01L 23/48* (2006.01)
(52) U.S. Cl. .. 257/738; 257/737; 257/778; 257/E23.021
(58) Field of Classification Search .................. 257/737, 257/738, 778, E23.021

See application file for complete search history.

(56) References Cited

U.S. PATENT DOCUMENTS

| 4,477,828 | A | 10/1984 | Scherer |
| 5,331,205 | A | 7/1994 | Primeaux |
| 5,438,224 | A | 8/1995 | Papageorge |
| 5,557,842 | A | 9/1996 | Bailey |
| 6,198,171 | B1 | 3/2001 | Huang |
| 6,294,407 | B1 | 9/2001 | Jacobs |
| 6,528,873 | B1 | 3/2003 | Heinen |
| 6,867,499 | B1 | 3/2005 | Tabrizi |
| 6,985,364 | B2 | 1/2006 | Higashitani |
| 7,074,649 | B2 | 7/2006 | Hedler |
| 7,189,593 | B2 | 3/2007 | Lee |
| 7,247,932 | B1 * | 7/2007 | Lin et al. ........................ 257/686 |
| 7,288,835 | B2 | 10/2007 | Yim |

(Continued)

FOREIGN PATENT DOCUMENTS

DE  102 50 538 A1  5/2004

OTHER PUBLICATIONS

U.S. Appl. No. 12/370,537, filed Feb. 12, 2009, Notification date Mar. 22, 2010, Office Action.

*Primary Examiner* — Roy Potter
(74) *Attorney, Agent, or Firm* — Winston Hsu; Scott Margo

(57) ABSTRACT

A system-in-package includes a package carrier; a first semiconductor die having a die face and a die edge, the first semiconductor die being assembled face-down to a chip side of the package carrier; a second semiconductor die mounted alongside of the first semiconductor die; a rewiring laminate structure comprising a re-routed metal layer between the first semiconductor die and the package carrier. At least a portion of the re-routed metal layer projects beyond the die edge. A plurality of bumps are arranged on the rewiring laminate structure for electrically connecting the first semiconductor die with the package carrier.

32 Claims, 18 Drawing Sheets

U.S. PATENT DOCUMENTS

| | | |
|---|---|---|
| 7,312,519 B2 | 12/2007 | Song et al. |
| 7,354,800 B2 | 4/2008 | Carson |
| 7,372,141 B2 | 5/2008 | Karnezos |
| 7,489,041 B2 | 2/2009 | Akram |
| 7,566,966 B2 | 7/2009 | Chow |
| 7,838,975 B2 * | 11/2010 | Chen .................... 257/676 |
| 7,892,889 B2 | 2/2011 | Howard |
| 2002/0024151 A1 | 2/2002 | Yang |
| 2004/0140559 A1 | 7/2004 | Goller |
| 2005/0023657 A1 | 2/2005 | Tsai |
| 2005/0272182 A1 | 12/2005 | Smith |
| 2007/0262436 A1 | 11/2007 | Kweon |
| 2008/0074852 A1 | 3/2008 | Lee |
| 2008/0128884 A1 | 6/2008 | Meyer |
| 2008/0258291 A1 | 10/2008 | Liu |
| 2008/0290487 A1 | 11/2008 | Zhao |
| 2009/0166821 A1 | 7/2009 | Camacho |
| 2009/0206461 A1 | 8/2009 | Yoon |
| 2009/0212410 A1 | 8/2009 | Wu |
| 2009/0230520 A1 | 9/2009 | Lee |
| 2009/0230566 A1 | 9/2009 | Hisada |
| 2009/0250822 A1 | 10/2009 | Chen |
| 2010/0032821 A1 | 2/2010 | Pagalla |
| 2010/0123236 A1 | 5/2010 | Kang |
| 2010/0213588 A1 | 8/2010 | Hsieh |
| 2010/0213589 A1 | 8/2010 | Hsieh |
| 2011/0133325 A1 | 6/2011 | Moon |

* cited by examiner

SYSTEM-IN-PACKAGE WITH FAN-OUT WLCSP

CROSS REFERENCE TO RELATED APPLICATIONS

This is a continuation-in-part of U.S. application Ser. No. 12/370,537 filed Feb. 12, 2009, which claims the benefits from U.S. provisional application No. 61/056,401 filed May 27, 2008 and is hereby incorporated by reference. This application also claims the benefits from U.S. provisional application No. 61/347,494 filed May 24, 2010, which is hereby incorporated by reference.

BACKGROUND OF THE INVENTION

1. Field of the Invention

The present invention relates generally to semiconductor packaging and, more particularly, to a flip-chip package for high-pin-count applications.

2. Description of the Prior Art

As known in the art, there are a variety of chip package techniques such as ball grid array (BGA), wire bonding, flip-chip, etc. for mounting a die on a substrate via the bonding points on both the die and the substrate. In order to ensure miniaturization and multi-functionality of electronic products or communication devices, semiconductor packages are required to be of small in size, multi-pin connection, high speed, and high functionality.

Increased Input-Output (I/O) pin count combined with increased demands for high performance ICs has led to the development of Flip-Chip Packages. Flip-chip technique uses bumps on bonding pads on chip to interconnect directly to the package medium. The chip is bonded face down to the package medium through the shortest path. The technique can be applied not only to single-chip packaging, but also to higher or integrated levels of packaging in which the packages are larger and to more sophisticated substrates that accommodate several chips to form larger functional units. The flip-chip technique, using an area array, has the advantage of achieving the highest density of interconnection to the device and a very low inductance interconnection to the package.

FIG. 1 is a schematic, cross-sectional diagram illustrating a conventional flip-chip chip scale package (FCCSP). As shown in FIG. 1, the FCCSP 100 comprises a die 101 mounted face-down on a top surface of the carrier 120 and is connected to the carrier 120 through solder bumps 102. A plurality of solder balls 122 are provided on a bottom surface of the carrier 120 for the connection with a circuit board. This package construction typically utilizes eutectic tin/lead flip-chip interconnect technique, in either area array or peripheral bump layout, replacing standard wire-bond interconnect. The elimination of wire-bond loops allows for a low inductance connection to the die, while the increased routing density enables optimized electrical paths for critical high frequency signal lines.

FIG. 2 is a schematic, cross-sectional diagram illustrating a conventional flip-chip ball grid array (FCBGA) package. As shown in FIG. 2, the FCBGA package 200 comprises a die 201 mounted face down on a top surface of a chip carrier substrate 220 and is connected to the chip carrier substrate 220 through the solder bumps 202. An underfill 203 fills the gap between the die 201 and the top surface of the chip carrier substrate 220. The chip carrier substrate 220 may comprise multi-layer traces, and different layers of traces are interconnected together through blind via 222 or buried via 224. For example, the blind via 222 may be drilled by laser for achieving a higher density. A plurality of solder balls 226 are provided on a bottom surface of the chip carrier substrate 220. The FCBGA package 200 allows for the design of advanced packaging solutions that are ideal for current and future high-speed networking and digital TV systems. For example, to maintain signal integrity, this package features low inductance, low dielectric loss and impedance matching.

However, the conventional flip-chip technique is facing the challenge of bump pitch limitation on the substrate. Besides, a high-performance FCBGA package is costly due to the expensive chip carrier substrate that typically comprises 1+2+1 or more-layer build up. The bottleneck of the flip-chip roadmap is the bump pitch of the substrate since the development and shrinkage of the bump pitch is much slower than the die shrinking and the increase of the pin count. Even the die shrinking will exceed the shrinkage of bump pitch resolution on substrate carrier in the future. To conquer the issue of such technology gap, Silicon interposer and TSV (Through Silicon Via) technology are the only and very expensive solution. Therefore, there is a strong need in this industry to provide an improved flip-chip package that is cost-effective and can overcome the bump pitch limitation on the substrate.

SUMMARY OF THE INVENTION

It is one object of this invention to provide a flip-chip package for high-pin-count applications, which is cost-effective and can overcome the bump pitch limitation on the substrate.

According to the embodiments, a flip-chip package includes a package carrier; a semiconductor die having a die face and a die edge, the semiconductor die being assembled face-down to a chip side of the package carrier, wherein a plurality of contact pads are situated on the die face; a rewiring laminate structure between the semiconductor die and the package carrier, the rewiring laminate structure comprising a re-routed metal layer, wherein at least a portion of the re-routed metal layer projects beyond the die edge; and a plurality of bumps arranged on the rewiring laminate structure for electrically connecting the semiconductor die with the package carrier.

In one aspect, a semiconductor chip package includes a semiconductor die having thereon a plurality of contact pads on its die face; a mold cap encapsulating a portion of the semiconductor die; a redistribution layer covering the die face and a portion of the mold cap for redistributing, wherein the redistribution layer fans out the contact pads; a plurality of bumps on the redistribution layer; a substrate with two metal wiring layers disposed on a chip side and on an opposite side respectively, wherein the plurality of bumps are mounted on the chip side; and a plurality of solder balls on the opposite side of the substrate.

In another aspect, a semiconductor chip package includes a package carrier having a chip side and on an opposite side; a fan-out wafer level device mounted on the chip side of the package carrier; and an underfill between the package carrier and the fan-out wafer level device.

In still another aspect, a semiconductor chip package includes: a semiconductor die having thereon a plurality of contact pads on its die face; a mold cap encapsulating a portion of the semiconductor die; a redistribution layer covering the die face and a portion of the mold cap for redistributing, wherein the redistribution layer fans out the contact pads; a plurality of bumps on the redistribution layer; and a leadframe, wherein the semiconductor die is mounted on the leadframe.

In still another aspect, a semiconductor chip package includes: a package carrier having a chip side and an opposite side; a fan-out wafer level device mounted on the chip side of the package carrier; and a molding compound encapsulating the fan-out wafer level device and the molding compound also filling into a gap between the package carrier and the fan-out wafer level device.

The present invention takes advantage of the WLCSP technology and fans out small-pitch I/O pins or bumps of a chip such that the fan-out pads meet the minimum bump pitch requirement of the laggard flip-chip process.

From still another aspect of this invention, a system-in-package is provided. The system-in-package includes a package carrier; a first semiconductor die having a die face and a die edge, the first semiconductor die being assembled face-down to a chip side of the package carrier, wherein a plurality of contact pads are situated on the die face; a second semiconductor die mounted on the package carrier alongside of the first semiconductor die; a rewiring laminate structure between the first semiconductor die and the package carrier, the rewiring laminate structure comprising a re-routed metal layer, wherein at least a portion of the re-routed metal layer projects beyond the die edge; and a plurality of bumps arranged on the rewiring laminate structure for electrically connecting the first semiconductor die with the package carrier.

From still another aspect of this invention, a system-in-package includes a package carrier having a chip side and an opposite side; a fan-out wafer level device comprising a first semiconductor die mounted on the chip side of the package carrier; a second semiconductor die mounted on the package carrier alongside of the first semiconductor die; and an underfill between the package carrier and the fan-out wafer level device.

From still another aspect of this invention, a system-in-package includes a package carrier having a chip side and an opposite side; a fan-out wafer level device mounted comprising a first semiconductor die on the chip side of the package carrier; a second semiconductor die mounted on the package carrier alongside of the first semiconductor die; and a molding compound encapsulating the fan-out wafer level device and the molding compound also filling into a gap between the package carrier and the fan-out wafer level device.

These and other objectives of the present invention will no doubt become obvious to those of ordinary skill in the art after reading the following detailed description of the preferred embodiment that is illustrated in the various figures and drawings.

DETAILED DESCRIPTION

The present invention pertains to a flip-chip package for high-pin-count applications, which may involve the use of wafer-level packaging (WLP) technique. Wafer-level packaging (WLP) refers to the technique of packaging an integrated circuit at wafer level, instead of the traditional process of assembling the package of each individual unit after wafer dicing. WLP is essentially a true chip-scale packaging (CSP) technique, since the resulting package is practically of the same size as the die. Furthermore, wafer-level packaging paves the way for true integration of wafer fabrication, packaging, test, and burn-in at wafer level, for the ultimate streamlining of the manufacturing process undergone by a device from silicon start to customer shipment.

The present invention takes advantage of the WLCSP technology and fans out small pitch I/O pins or bumps on a chip such that the fan-out bond pads meet the minimum bump pitch requirement (e.g., 150 nm) of current flip-chip process, but not limited to. A package carrier is used to mechanically support the fan-out rewiring laminate structure having a number of fan-out bond pads that exceeds, for example, 300.

Figure 3:
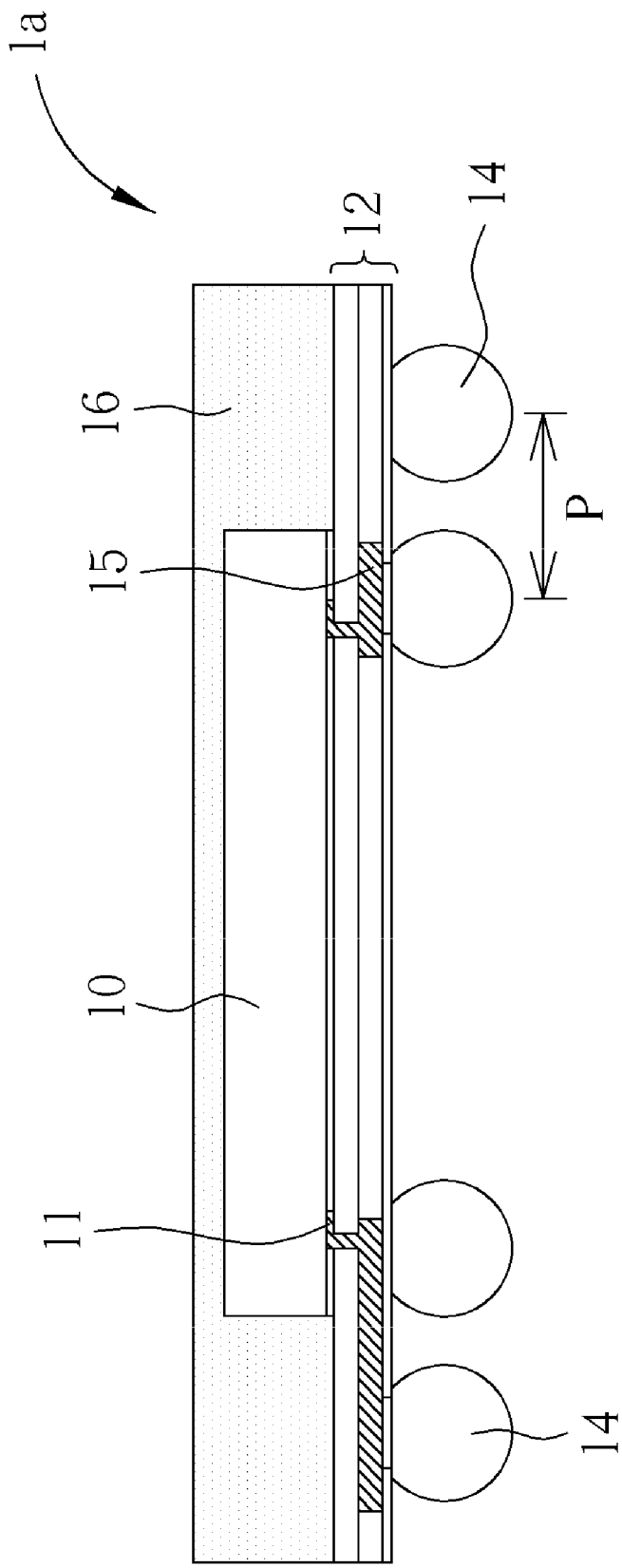
FIG. 3 is a schematic, cross-sectional diagram showing a fan-out wafer level package (WLP) according to this invention.

FIG. 3 is a schematic, cross-sectional diagram showing a fan-out wafer level package (WLP) according to one embodiment of this invention. As shown in FIG. 3, the fan-out WLP 1a comprises a semiconductor die 10 and a mold cap 16 encapsulates a portion of the semiconductor die 10, for example, the whole surface of the semiconductor die 10 is encapsulated except for the die face where the contact pads 11 are formed. A rewiring laminate structure 12 is provided directly on the die face and on a partial surface of the mold cap 16.

The re-routed metal layer in the rewiring laminate structure 12 redistributes the contact pads 11 on the die face of the semiconductor die 10 to form fan-out bond pads 15 on the insulating layer. Thereafter, the solder balls 14 are attached to the fan-out bond pads 15. If the fan-out WLP of FIG. 3 is directly mounted onto a printed circuit board (PCB) using a flip-chip technique, in one example, a ball pitch (P) of 0.5 mm is typically required for the FCCSP, which limits the maximum solder ball number of the fan-out WLP to 300 or less.

Figure 4:
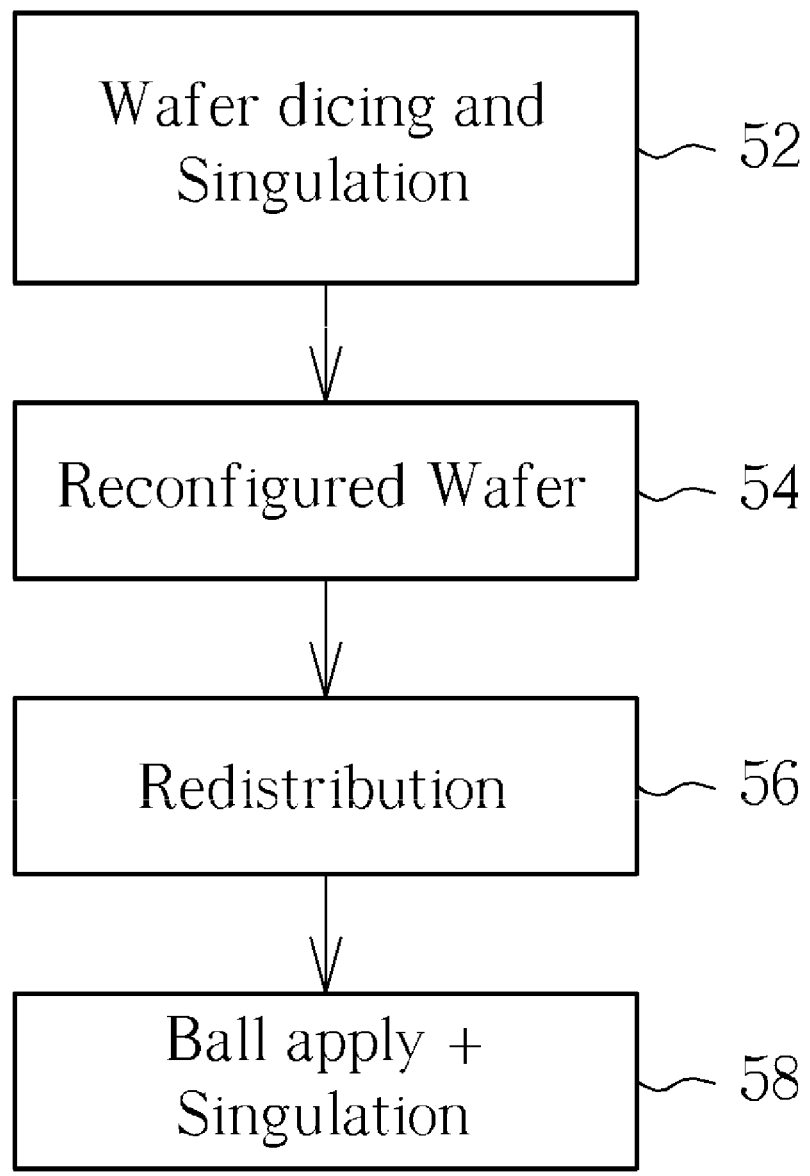
FIG. 4 is a flow chart of the steps for manufacturing the fan-out WLP of FIG. 3.

The exemplary steps for manufacturing the fan-out WLP of FIG. 3 are shown in FIG. 4. The fan-out WLP can be manufactured by several stages including wafer dicing and singulation (Step 52), wafer reconfiguration (Step 54), redistribution (Step 56), and ball implantation and package singulation (Step 58). It is understood that the fan-out WLP can be manufactured by other methods. Different companies using redistribution technique implement the fan-out WLP using different materials and processes. Nonetheless, the steps required are somewhat similar.

Redistribution layer and bump technique extends the conventional wafer fabrication process with an additional step that deposits a multi-layer thin-film metal rerouting and interconnection system to each device, e.g. chip, on the wafer. This is achieved using the similar and compatible photolithography and thin film deposition techniques employed in the device fabrication itself. This additional level of interconnection redistributes the peripheral contact pads of each chip to an area array of underbump metal (UBM) pads that are evenly deployed over the chip's surface. The solder balls or bumps used in connecting the chip to the application circuit board are subsequently placed over these UBM pads, e.g. the fan-out bond pads 15.

For example, the first layer put over the wafer to package the device is usually a benzocyclobutane (BCB)-based polymer dielectric, to isolate the device circuitry from the rewiring system, e.g. rewiring laminate structure. A rewiring metallization layer, usually Cu, Al, or a specially-developed alloy, is then deposited over this dielectric. This rewiring metallization layer is then covered by another BCB dielectric layer serving as the solder mask. Underbump metallization is then put over the positions to be subsequently occupied by the solder balls. After the balls have been attached, flip-chip techniques are used to mount the fan-out WLP onto the circuit board.

Figure 5:
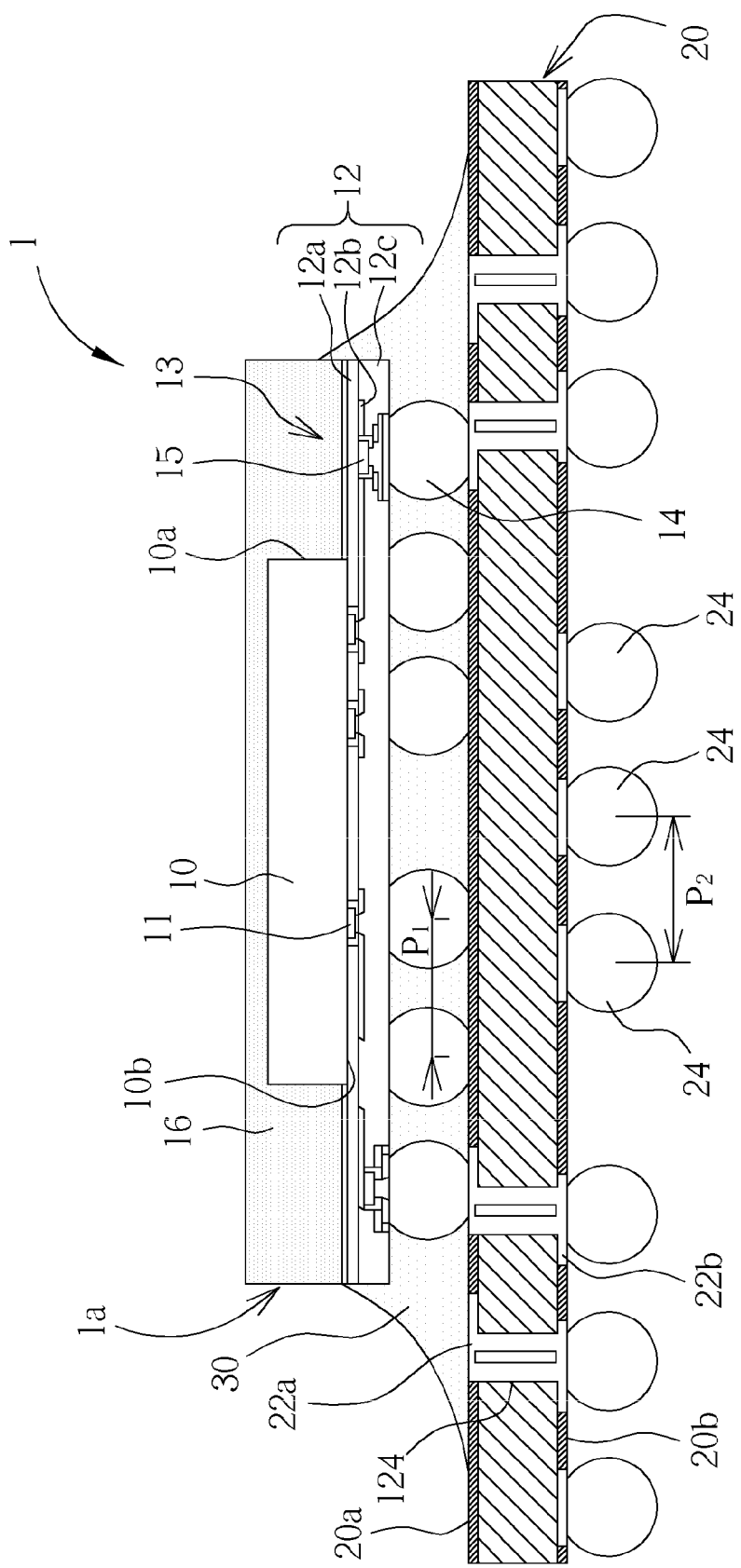
FIG. 5 is a schematic, cross-sectional diagram illustrating a flip-chip package in accordance with one embodiment of this invention.

FIG. 5 is a schematic, cross-sectional diagram illustrating a flip-chip package in accordance with one embodiment of this invention. As shown in FIG. 5, the flip-chip package 1 includes a flipped semiconductor die 10 that is assembled face-down to a chip side 20a of a package carrier 20. For example, the package carrier 20 is a package substrate with two metal wiring layers 22a and 22b disposed on the chip side 20a and on an opposite side 20b respectively. The metal wiring layers 22a and 22b are electrically interconnected to each other by means of plated through holes 124 that are formed in the package carrier 20 by mechanical drilling methods according to this embodiment. Further, it is understood that the package carrier 20 may have multiple metal wiring layers, for example, four layers or six layers. In another embodiment, the package carrier 20 may be a leadframe.

Figure 1:
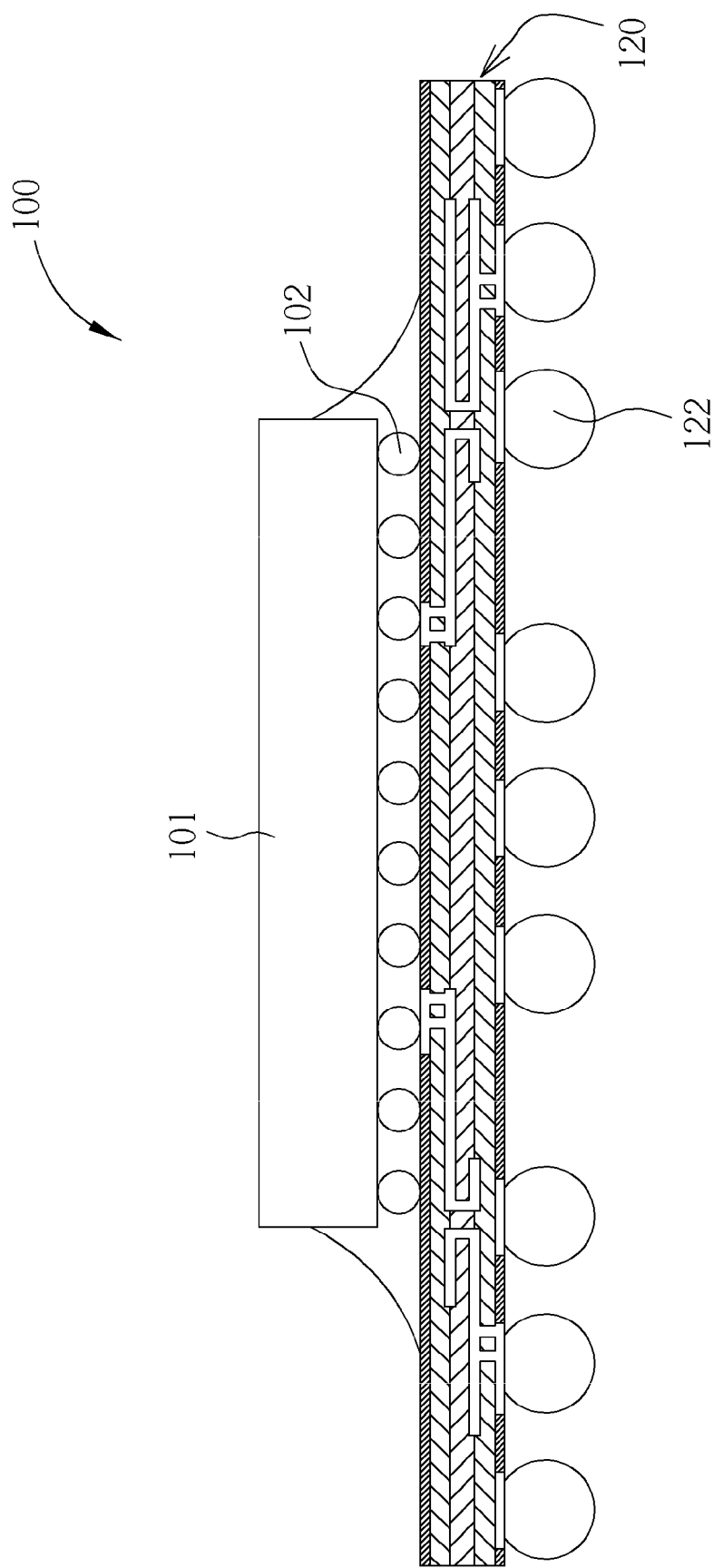
FIG. 1 is a schematic, cross-sectional diagram illustrating a conventional flip-chip CSP package.
Figure 2:
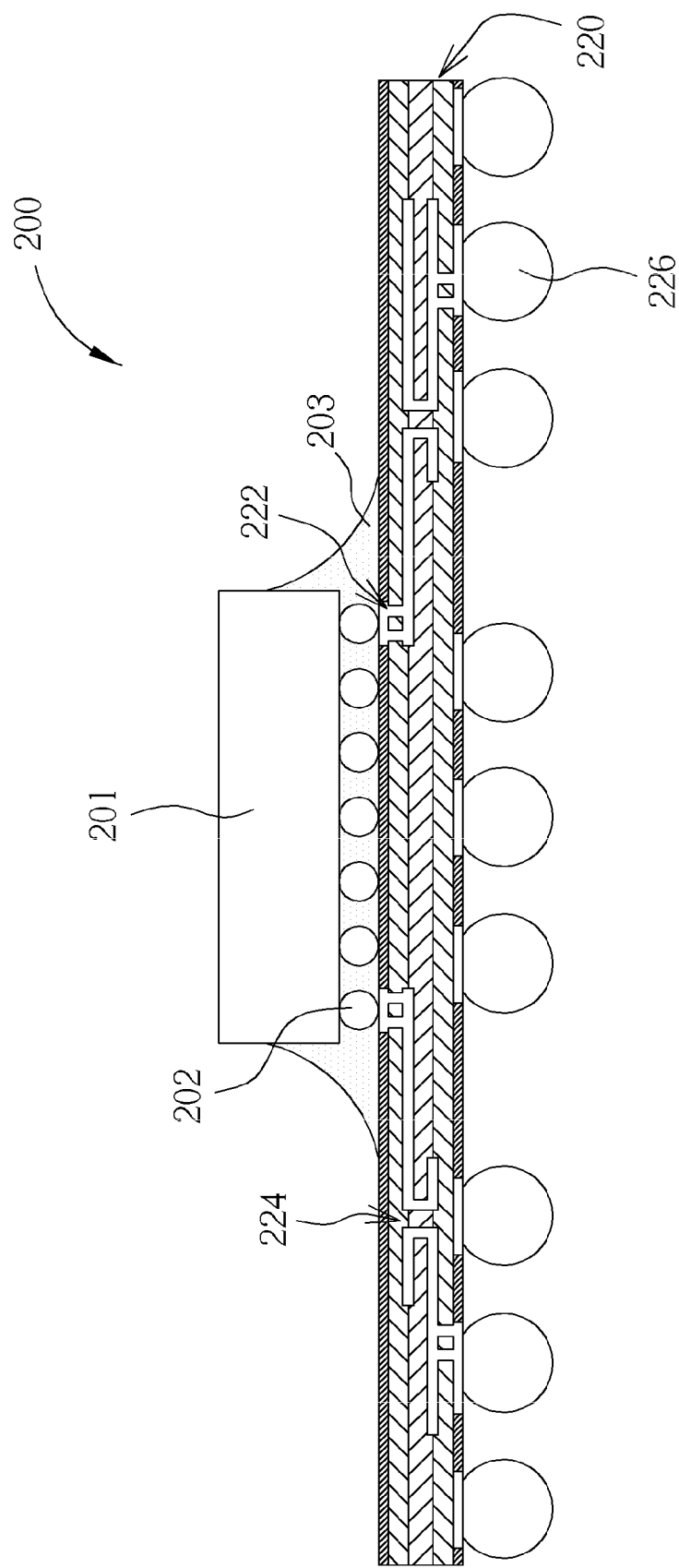
FIG. 2 is a schematic, cross-sectional diagram illustrating a conventional flip-chip BGA package.

It is advantageous to use this embodiment because by applying the mechanical drilled package carrier 20 the cost of the chip package is greatly reduced (compared to the laser drilled package carrier, e.g. the chip carrier substrate 220 in FIG. 2). In addition, the original fan-out WLP as illustrated in FIG. 3 has its limit to the number of the I/O pin count, typically less than 300. This embodiment is able to overcome this limit.

The semiconductor die 10 is a redistributed high-pin-count chip, for example, with an I/O pin count that exceeds 300. By way of example, the flip-chip package 1 is particularly suited for chips with at least 500 I/O pin count. Typically, for such high-pin-count applications, it is known that incorporation of an expensive chip carrier substrate with 1+2+1 build up or a costly silicon interposer is inevitable. This embodiment of the present invention can enable the elimination of such expensive chip carrier substrate with 1+2+1 build up or a costly silicon interposer.

It is one germane feature of this embodiment that at least one rewiring laminate structure 12 is provided directly on the die face of the semiconductor die 10, and a mold cap 16 encapsulates a portion of the semiconductor die 10, e.g. the whole surface except for the die face where the contact pads 11 are formed. According to the embodiment of this invention, the rewiring laminate structure 12 comprises an insulating layer 12a, a re-routed metal layer 12b and a solder resist layer 12c. At least a portion of the re-routed metal layer 12b as specifically indicated by numeral number 13 projects beyond the die edge 10a. That is, the re-routed metal layer 12b laterally extends over a surface of the mold cap 16 that is substantially coplanar with the die face 10b where the contact pads 11 are formed.

The re-routed metal layer 12b redistributes the contact pads 11 on the die face of the semiconductor die 10 to form fan-out bond pads 15 on the insulating layer 12a, thereby overcoming the bump pitch limitation on the substrate. It is noteworthy that there may be different types and choices of the fan-out bond pads 15, which should not limit the scope of the invention. The term "on the insulating layer 12a" herein means that the fan-out bond pads 15 is disposed on a surface of the insulating layer 12a and, for example, is formed after the insulating layer 12a is deposited.

The embodiment of the invention is capable of overcoming another bump pitch limitation caused by small die size because the rewiring laminate structure 12 is formed during the wafer processing and fabrication and thus a more flexible pitch rule is provided by the rewiring laminate structure 12. Accordingly, the maximum pad number can be increased due to the fan-out structure of the rewiring laminate structure 12.

The semiconductor die 10 is electrically connected to the package carrier 20 through the re-routed metal layer 12b and the solder bumps 14 disposed on the fan-out bond pad 15 defined in the rewiring laminate structure 12. The solder bumps 14 may comprise eutectic (e.g. 63% Sn, 37% Pb) or high lead (e.g. 95% Pb, 5% Sn) or lead-free (e.g. 97.5% Sn, 2.5% Ag) compositions. According to the embodiments of this invention, the bump pitch P1 of the solder bumps 14 is about 0.15-0.3 mm. On the opposite side 20b, a plurality of solder balls 24 are provided with a ball pitch P2 of about 0.5 mm, for example, with the PCB utilized in FCCSP.

There are many known processes for flip-chip bumping. Solder bumping may, for example, put underbump metallization (UBM) over the bond pad by sputtering, plating, or a similar means. This process of putting UBM removes the passivating oxide layer on the bond pad and defines the solder-wetted area. Solder may then be deposited over the UBM by a suitable method, e.g., evaporation, electroplating, screen-printing, or needle-depositing, etc.

The solder bumped die 10 is attached to the package carrier 20 by a solder reflow process. Thereafter, an underfill 30 is then added between the rewiring laminate structure 12 and the package carrier 20. The underfill 30 may be a specially engineered epoxy that fills the gap between the rewiring laminate structure 12 and the package carrier 20, surrounding the solder bumps 14. It is designed to control the stress in the solder joints caused by the difference in thermal expansion between the semiconductor die 10 and the package carrier 20. Once cured, the underfill 30 absorbs the stress, reducing the strain on the solder bumps 14, greatly increasing the life of the finished package.

In one aspect, a semiconductor chip package (e.g. the flip-chip package 1) comprises a semiconductor die 10 having thereon a plurality of contact pads 11 on its die face, a mold cap 16 encapsulating a portion of the semiconductor die 10e, and a redistribution layer (e.g. the rewiring laminate structure 12) covering the die face and a portion of the mold cap 16 for redistributing. The redistribution layer fans out the contact pads 11. A plurality of bumps 14 is disposed on the redistribution layer. The semiconductor chip package further comprises a substrate (e.g. the package carrier 20) with two metal wiring layers 22a and 22b disposed on a chip side 20a and on an opposite side 20b respectively. The plurality of bumps 14 are mounted on the chip side 20a. Solder balls 24 are disposed on the opposite side 20b of the substrate 20.

In another aspect, a semiconductor chip package (e.g. the flip-chip package 1) includes a package carrier 20 with two metal wiring layers 22a and 22b disposed on a chip side 20a and on an opposite side 20b of the package carrier 20 respectively. A fan-out wafer level device (e.g. the fan-out WLP 1a) is mounted on the chip side 20a of the package carrier 20. An underfill 30 is applied between the package carrier 20 and the fan-out wafer level device.

The embodiments of the present invention uses a cost-competitive two-layer, mechanically drilled substrate e.g. the package carrier 20, instead of expensive approaches, such as using the costly silicon interposer, for high-pin-count chips in order to achieve cost down on flip-chip package solution. The embodiments feature the rewiring laminate structure 12 provided directly on the die face. The re-routed metal layer 12b of the rewiring laminate structure 12 redistributes the contact pads 11 on the die face and forms the fan-out bond pads 15, thereby overcoming the bump pitch limitation on the substrate in the WLP.

Figure 6:
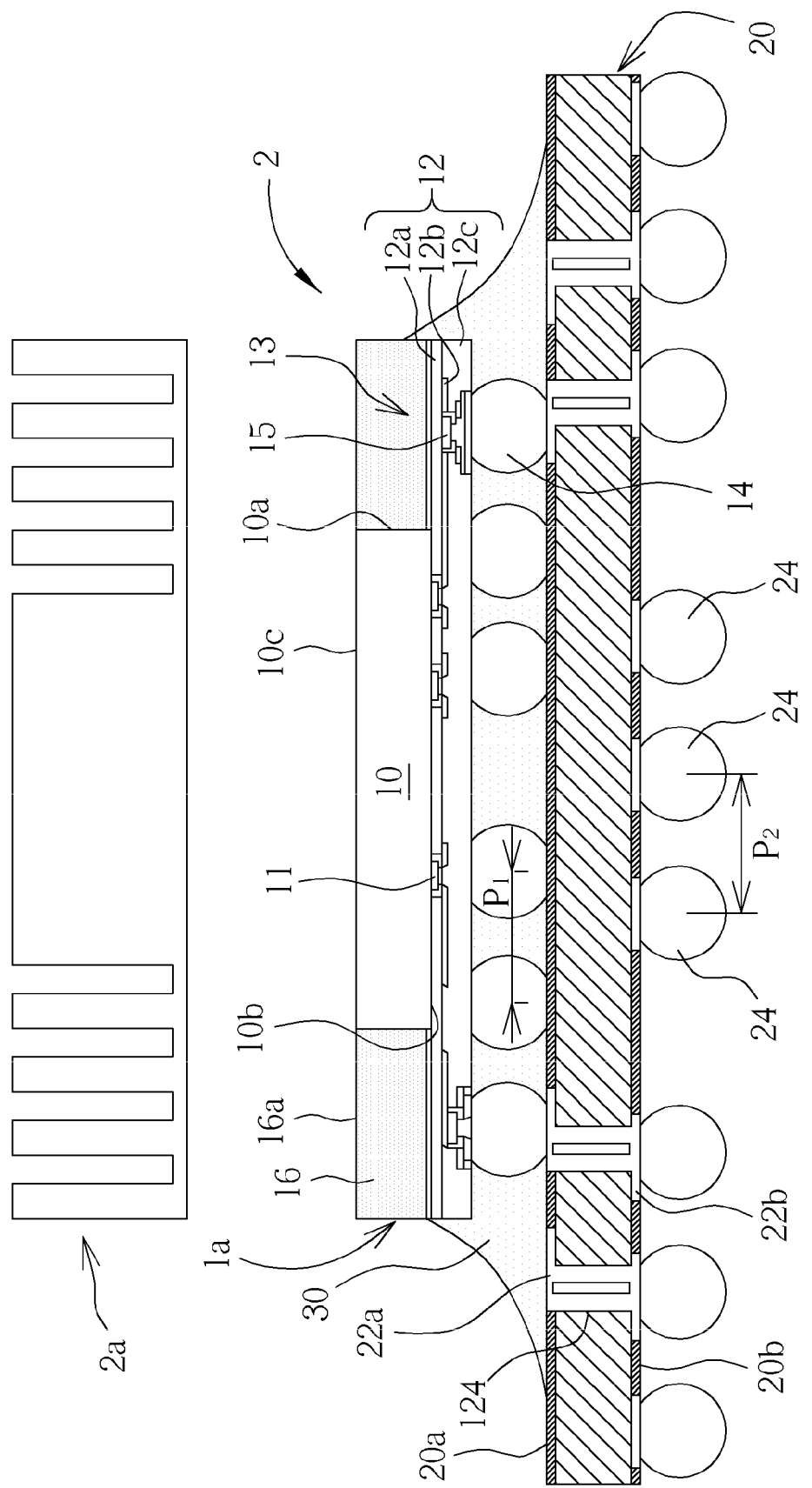
FIG. 6 is a schematic, cross-sectional diagram illustrating a flip-chip package in accordance with another embodiment of this invention.

FIG. 6 is a schematic, cross-sectional diagram illustrating a flip-chip package in accordance with another embodiment of this invention, wherein like numeral numbers designate like layers, elements or regions. As shown in FIG. 6, the flip-chip package 2 has a structure that is pretty much the same as the flip-chip package 1 set forth in FIG. 5 except that a bottom surface 10c opposite to the die face 10b is exposed by removing a portion of the mold cap 16 such that the top surface 16a of the mold cap 16 is flush with the bottom surface 10c. An external heatsink 2a can be mounted to the exposed bottom surface 10c of the semiconductor die 10. By doing this, the heat dissipating efficiency is improved. Of course, the external heatsink 2a of such type shown in FIG. 6 is only provided for illustration, not limiting the alternatives or modifications of this embodiment. That is, other types of heatsinks, which is able to be properly amounted to the exposed bottom surface 10c, should be implemented in this embodiment as well.

Figure 7:
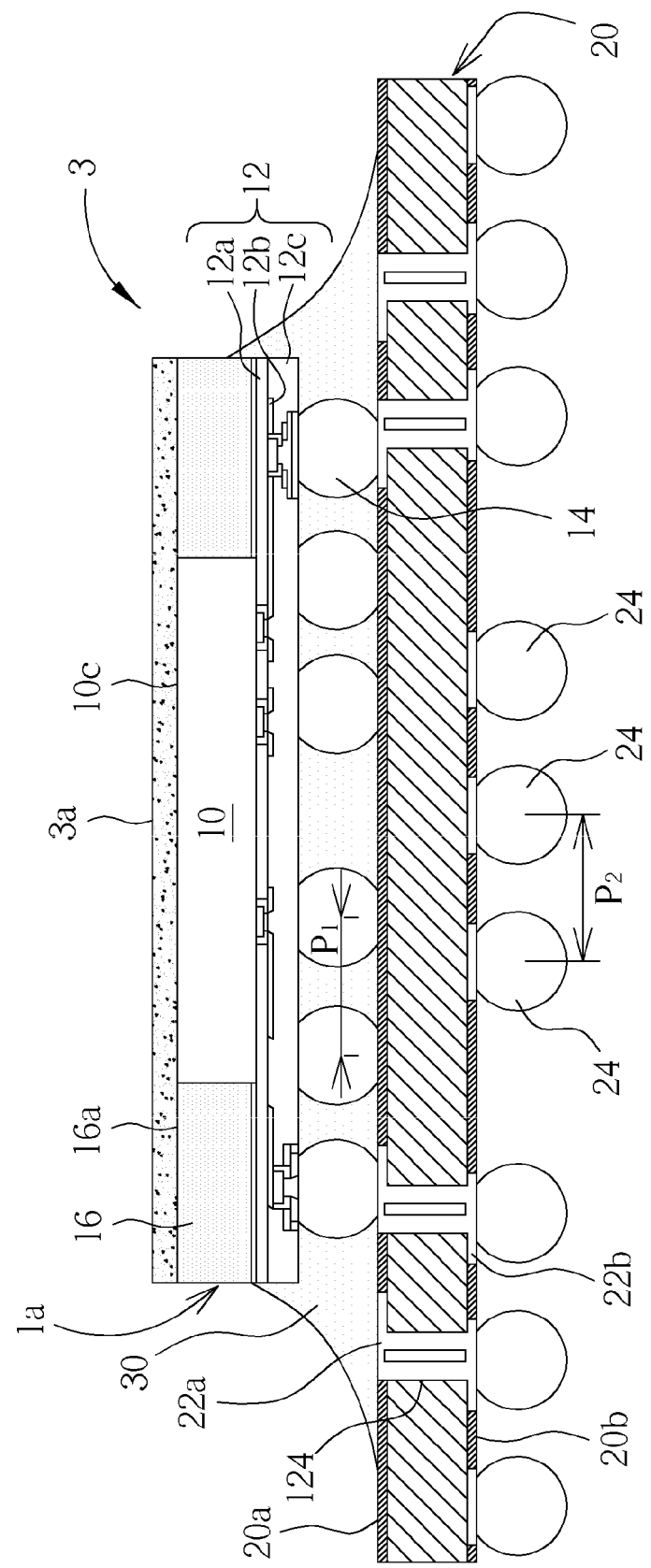
FIG. 7 is a schematic, cross-sectional diagram illustrating a flip-chip package in accordance with yet another embodiment of this invention.

FIG. 7 is a schematic, cross-sectional diagram illustrating a flip-chip package in accordance with yet another embodiment of this invention, wherein like numeral numbers designate like layers, elements or regions. As shown in FIG. 7, likewise, the flip-chip package 3 has a structure that is analogous to the flip-chip package 1 set forth in FIG. 5 except for an exposed bottom surface 10c opposite to the die face 10b. The bottom surface 10c is exposed by removing an upper portion of the mold cap 16 such that the top surface 16a of the mold cap 16 is substantially flush with the bottom surface 10c. The flip-chip package 3 further comprises a heat-spreading layer 3a mounted to the exposed bottom surface 10c and the top surface 16a of the mold cap 16 of the semiconductor die 10.

Figure 8:
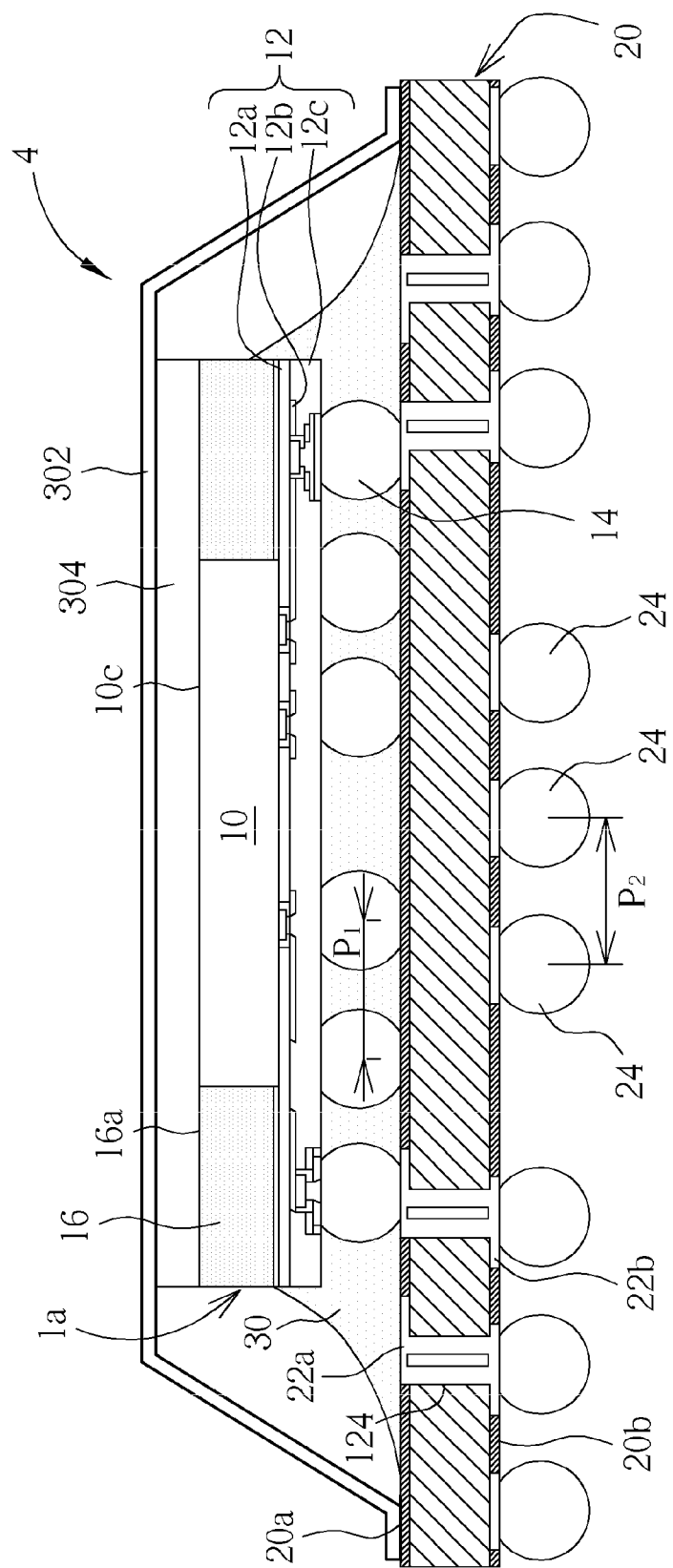
FIG. 8 is a schematic, cross-sectional diagram illustrating a flip-chip package in accordance with yet another embodiment of this invention.

FIG. 8 is a schematic, cross-sectional diagram illustrating a flip-chip package in accordance with yet another embodiment of this invention, wherein like numeral numbers designate like layers, elements or regions. As shown in FIG. 8, the flip-chip package 4 is analogous to the flip-chip package 1 set forth in FIG. 5 except for an exposed bottom surface 10c opposite to the die face 10b. The bottom surface 10c is exposed by removing or cutting off an upper portion of the mold cap 16 such that the top surface 16a of the mold cap 16 is substantially flush with the bottom surface 10c. A heat-spreading lid 302 is mounted on exposed bottom surface 10c. A layer of thermal glue 304 may be applied on the exposed bottom surface 10c before assembling the heat-spreading lid 302. In another embodiment, the heat-spreading lid 302 may be directly in contact with the exposed bottom surface 10c.

Figure 9:
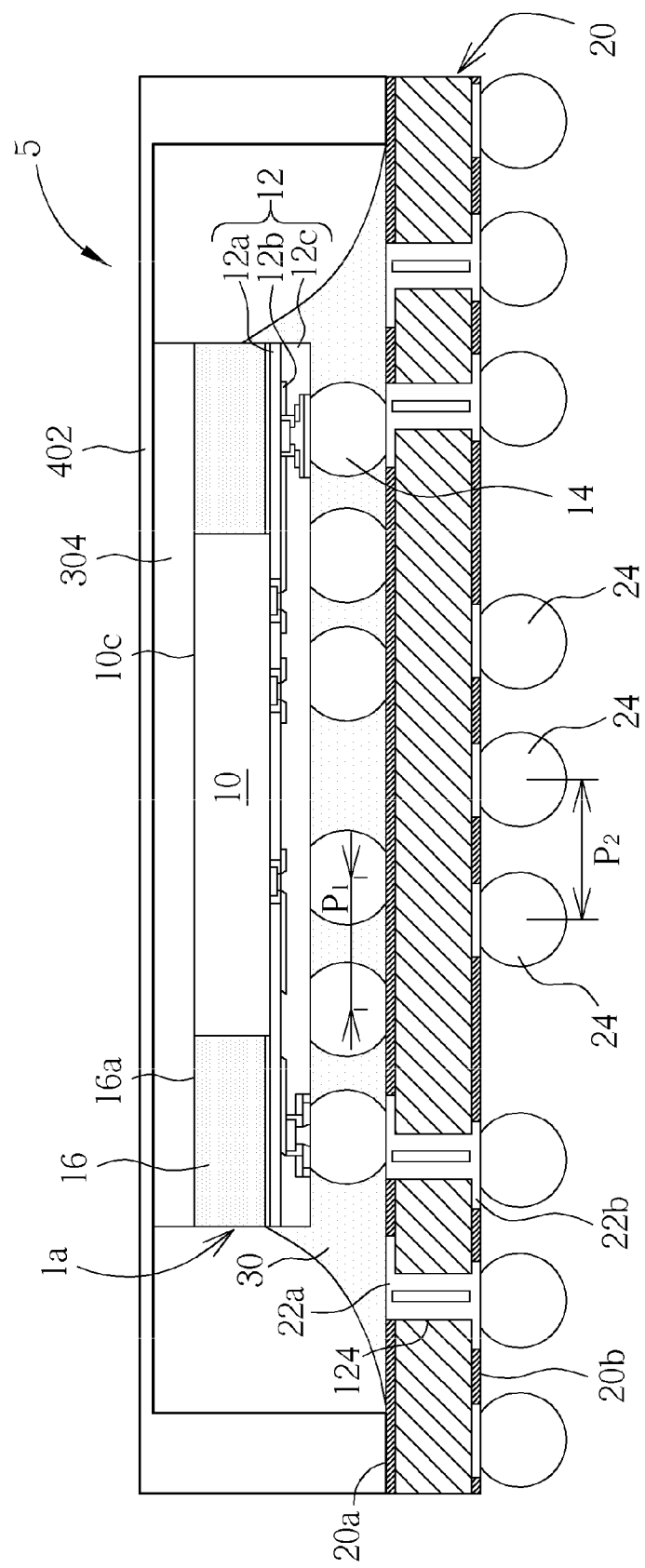
FIG. 9 is a schematic, cross-sectional diagram illustrating a flip-chip package in accordance with yet another embodiment of this invention.

FIG. 9 is a schematic, cross-sectional diagram illustrating a flip-chip package in accordance with yet another embodiment of this invention, wherein like numeral numbers designate like layers, elements or regions. As shown in FIG. 9, the flip-chip package 5 is analogous to the flip-chip package 1 set forth in FIG. 5 except for an exposed bottom surface 10c opposite to the die face 10b. The bottom surface 10c is exposed by removing or cutting off an upper portion of the mold cap 16 such that the top surface 16a of the mold cap 16 is substantially flush with the bottom surface 10c. The flip-chip package 5 includes a one-piece, monolithic heat spreader 402 that caps the semiconductor die 10. Likewise, a layer of thermal glue 304 may be applied on the exposed bottom surface 10c before assembling the heat spreader 402. In another embodiment, the heat spreader 402 may be directly in contact with the exposed bottom surface 10c.

Figure 10:
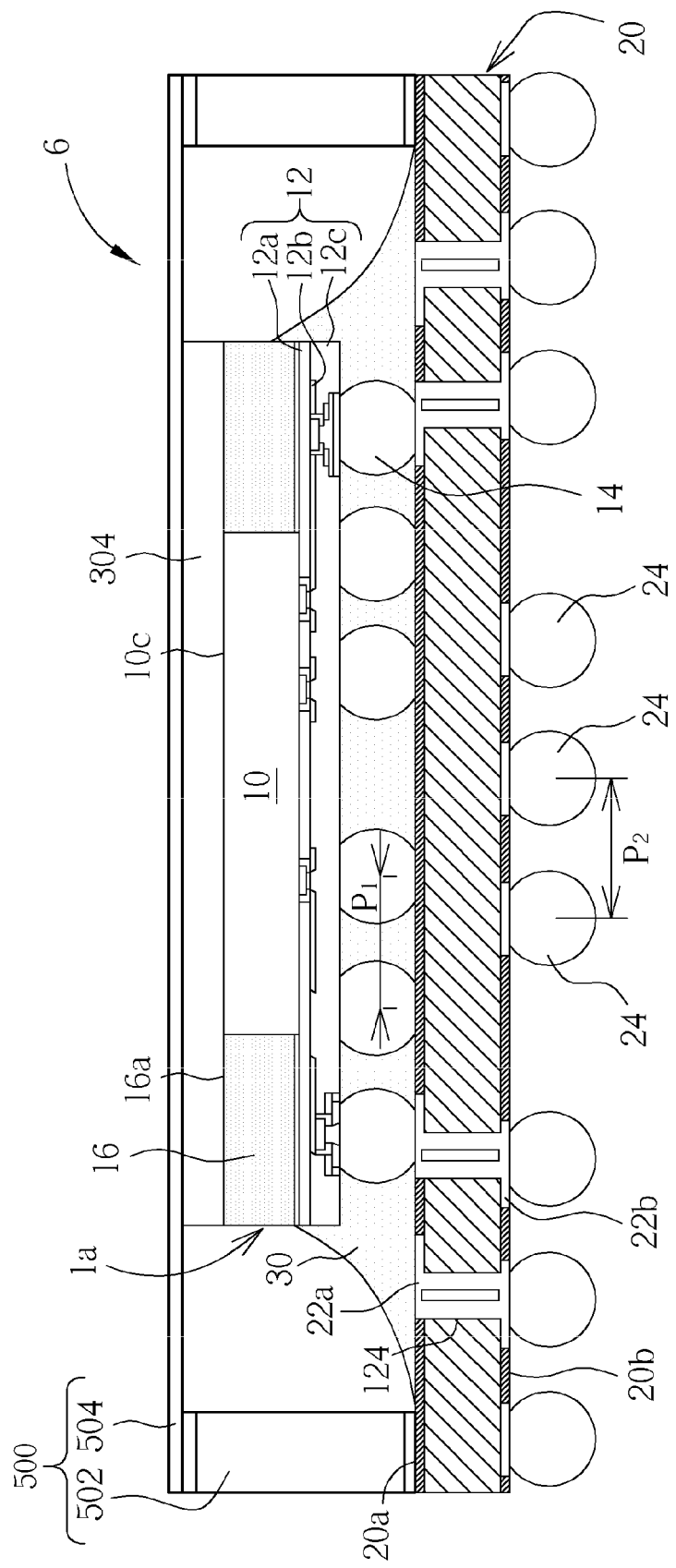
FIG. 10 is a schematic, cross-sectional diagram illustrating a flip-chip package in accordance with yet another embodiment of this invention.

FIG. 10 is a schematic, cross-sectional diagram illustrating a flip-chip package in accordance with yet another embodiment of this invention, wherein like numeral numbers designate like layers, elements or regions. As shown in FIG. 10, the flip-chip package 6 is analogous to the flip-chip package 1 set forth in FIG. 5 except for an exposed bottom surface 10c opposite to the die face 10b. The bottom surface 10c is exposed by removing or cutting off an upper portion of the mold cap 16 such that the top surface 16a of the mold cap 16 is substantially flush with the bottom surface 10c. The flip-chip package 6 comprises a two-piece heat spreader 500 including a frame 502 and a lid 504 that caps the semiconductor die 10. Likewise, a layer of thermal glue 304 may be applied on the exposed bottom surface 10c. In another embodiment, the lid 504 may be directly in contact with the exposed bottom surface 10c.

Figure 11:
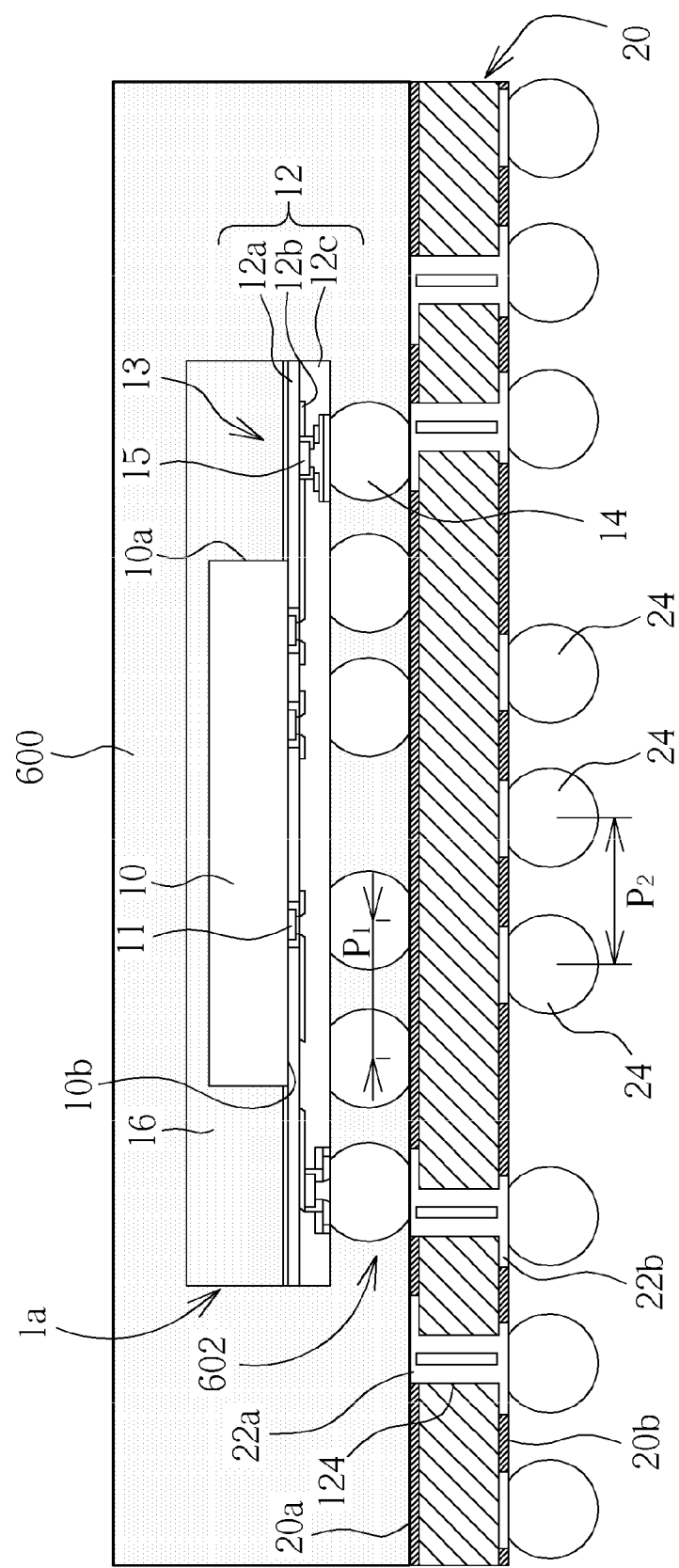
FIG. 11 is a schematic, cross-sectional diagram illustrating a flip-chip package in accordance with yet another embodiment of this invention.

FIG. 11 is a schematic, cross-sectional diagram illustrating a flip-chip package in accordance with yet another embodiment of this invention, wherein like numeral numbers designate like layers, elements or regions. As shown in FIG. 11, as the bump pitch $P_1$ of the solder bumps 14 is enlarged, in some cases, the underfill may be spared. Instead, a molding compound 600 encapsulates the fan-out WLP 1a and fills into the gap 602 between the rewiring laminate structure 12 and the chip side 20a of the package carrier 20, thereby forming a mold-only flip-chip chip-scale package (FCCSP).

Figure 12:
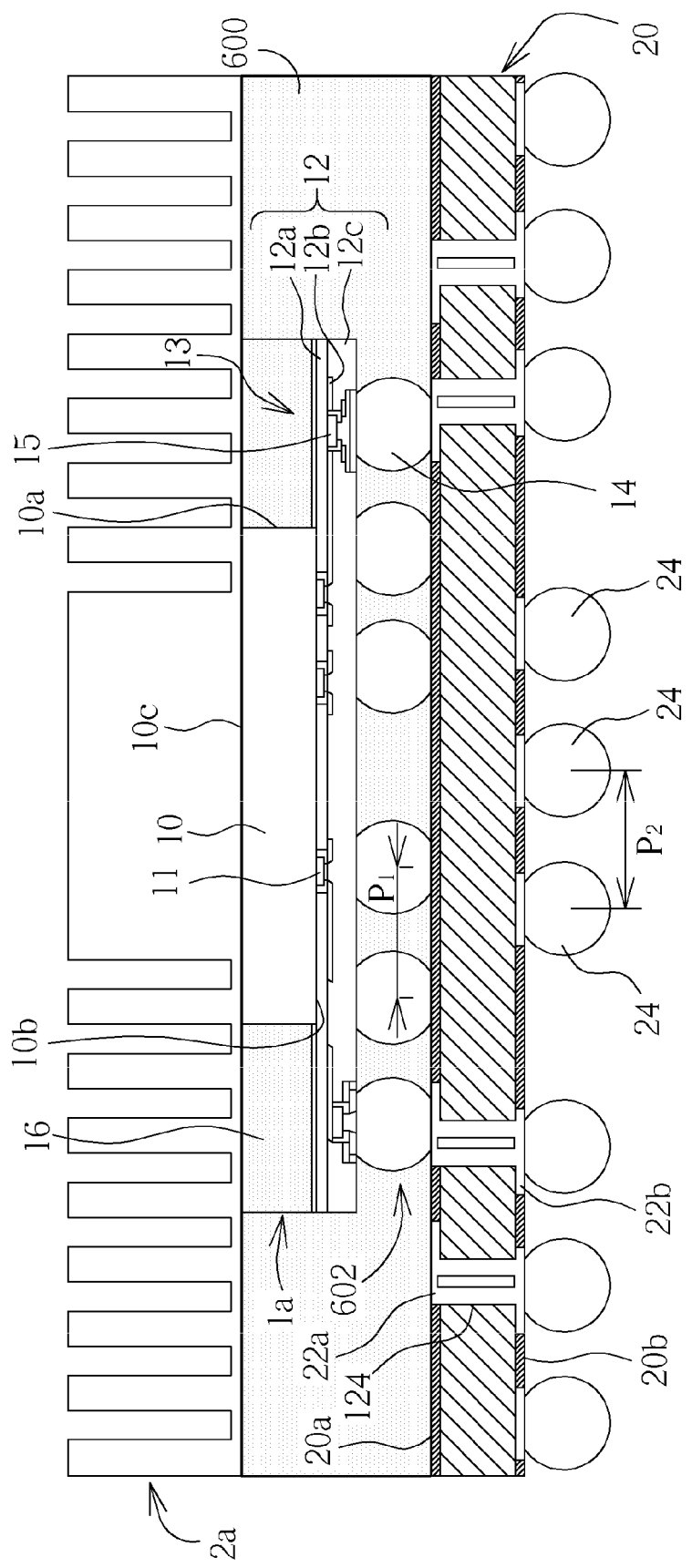
FIG. 12 is a schematic, cross-sectional diagram illustrating a flip-chip package in accordance with yet another embodiment of this invention.

FIG. 12 is a schematic, cross-sectional diagram illustrating a flip-chip package in accordance with yet another embodiment of this invention, wherein like numeral numbers designate like layers, elements or regions. As shown in FIG. 12, an upper portion of the molding compound 600 and an upper portion of the mold cap 16 are removed or cut off in order to expose the bottom surface 10c opposite to the die face 10b. The top surface 16a of the mold cap 16 is substantially flush with the bottom surface 10c. A heat sink 2a is mounted on the bottom surface 10c.

Figure 13:
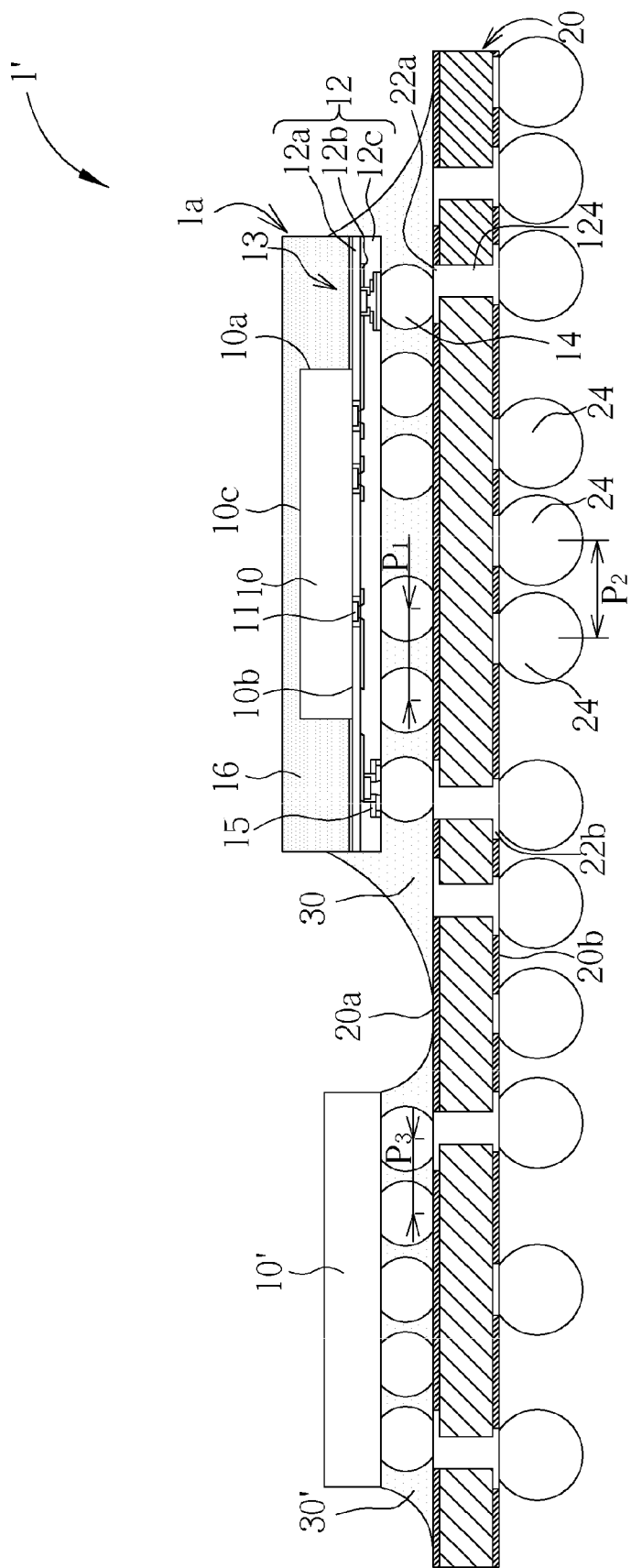
FIG. 13 is a schematic, cross-sectional diagram illustrating a system-in-package (SiP) in accordance with yet another embodiment of this invention.

FIG. 13 is a schematic, cross-sectional diagram illustrating a system-in-package (SiP) in accordance with yet another embodiment of this invention, wherein like numeral numbers designate like layers, elements or regions. As shown in FIG. 13, the SiP 1' comprises a fan-out WLP 1a as described in FIG. 5 and a semiconductor die 10', both of which are flip-chip mounted on the chip side 20a of the package carrier 20. According to this embodiment, the fan-out WLP 1a and the semiconductor die 10' are placed horizontally alongside one another. However, it is understood that other arrangements of the dies may be applicable without departing form the spirit of this invention. For example, the fan-out WLP 1a may be flip-chip mounted on the chip side 20a in adjacent to the semiconductor die 10', in a staggered manner but not necessarily side by side. An underfill 30 is applied between the package carrier 20 and the fan-out WLP 1a. An underfill 30' is applied between the package carrier 20 and the semiconductor die 10'.

The fan-out WLP 1a may include all the features as set forth in FIG. 5. For example, the fan-out WLP 1a may likewise comprise a flipped semiconductor die 10 that is assembled face-down to the chip side 20a of a package carrier 20. Preferably, the package carrier 20 may be a package substrate with two metal wiring layers 22a and 22b disposed on the chip side 20a and on an opposite side 20b respectively. The metal wiring layers 22a and 22b are electrically interconnected to each other by means of plated through holes 124 that are formed in the package carrier 20 by mechanical drilling methods according to this embodiment. Further, it is understood that the package carrier 20 may have multiple metal wiring layers, for example, four layers or six layers. The semiconductor die 10 may be a redistributed high-pin-count chip, for example, with an I/O pin count that may exceed 200.

At least one rewiring laminate structure 12 is provided directly on the die face of the semiconductor die 10, and a mold cap 16 encapsulates a portion of the semiconductor die 10, e.g. the whole surface except for the die face where the contact pads 11 are formed. According to the embodiment of this invention, the contact/bond pad pitch on the semiconductor die 10 is smaller than, and hence does not comply with, the bump pitch rule that is required on the chip side 20a of the package carrier 20. For example, the contact/bond pad pitch of the contact pads 11 on the die face of the semiconductor die 10 may range between 0.13-0.15 mm (130-150 μm). According to the embodiment of this invention, the rewiring laminate structure 12 comprises an insulating layer 12a, a re-routed metal layer 12b and a solder resist layer 12c. At least a portion of the re-routed metal layer 12b as specifically indicated by numeral number 13 projects beyond the die edge 10a. That is, the re-routed metal layer 12b laterally extends over a surface of the mold cap 16 that is substantially coplanar with the die face 10b where the contact pads 11 are formed.

The re-routed metal layer 12b redistributes the contact pads 11 on the die face of the semiconductor die 10 to form fan-out bond pads 15 on the insulating layer 12a, thereby overcoming the bump pitch limitation on the substrate. It is noteworthy that there may be different types and choices of the fan-out bond pads 15, which should not limit the scope of the invention. The term "on the insulating layer 12a" herein means that the fan-out bond pads 15 is disposed on a surface of the insulating layer 12a and, for example, is formed after the insulating layer 12a is deposited.

The semiconductor die 10 is electrically connected to the package carrier 20 through the re-routed metal layer 12b and the solder bumps 14 disposed on the fan-out bond pad 15 defined in the rewiring laminate structure 12. The solder bumps 14 may comprise eutectic (e.g. 63% Sn, 37% Pb) or high lead (e.g. 95% Pb, 5% Sn) or lead-free (e.g. 97.5% Sn, 2.5% Ag) compositions. According to the embodiments of this invention, the bump pitch $P_1$ of the solder bumps 14 is about 0.15-0.3 mm (150-300 μm), for example. On the opposite side 20b, a plurality of solder balls 24 are provided with a ball pitch $P_2$ of about 0.5 mm (500 μm), for example, with the PCB utilized in FCCSP.

There are many known processes for flip-chip bumping. Solder bumping may, for example, put underbump metallization (UBM) over the bond pad by sputtering, plating, or a similar means. This process of putting UBM removes the passivating oxide layer on the bond pad and defines the solder-wetted area. Solder may then be deposited over the UBM by a suitable method, e.g., evaporation, electroplating, screen-printing, or needle-depositing, etc. The solder bumped die 10 is attached to the package carrier 20 by a solder reflow process. Thereafter, the underfill 30 is added between the rewiring laminate structure 12 and the package carrier 20, and the underfill 30' is added between the semiconductor die 10' and the package carrier 20. The underfill 30 or 30' may be a specially engineered epoxy that fills the gap between the rewiring laminate structure 12 and the package carrier 20, surrounding the solder bumps 14. It is designed to control the stress in the solder joints caused by the difference in thermal expansion between the semiconductor die 10 and the package carrier 20. Once cured, the underfill 30 absorbs the stress, reducing the strain on the solder bumps 14, greatly increasing the life of the finished package.

According to this embodiment, the semiconductor die 10 (or primary die) has an I/O pin count that may exceed 200. Examples of such high-pin-count die or chip may include but not limited to baseband chips, RF chips or SoC chips, which may be fabricated with advanced semiconductor processes such as 28 nm technology. According to this embodiment, the semiconductor die 10' (or secondary die) has an I/O pin count that is less than 300. Examples of such low-pin-count die or chip may include but not limited to power-management IC (PMIC). Since the semiconductor die 10' has low I/O pin count, the bump pitch P3 applied between the semiconductor die 10' and the package carrier 20, which is substantially equal to the contact/bond pad pitch on the semiconductor die 10', is relatively loosened. Therefore, no fan-out is needed for the semiconductor die 10'. According to the embodiment of this invention, the bump pitch P3 or the contact/bond pad pitch on the die face of the semiconductor die 10' may range between 0.13-0.4 mm (130-400 μm).

Figure 14:
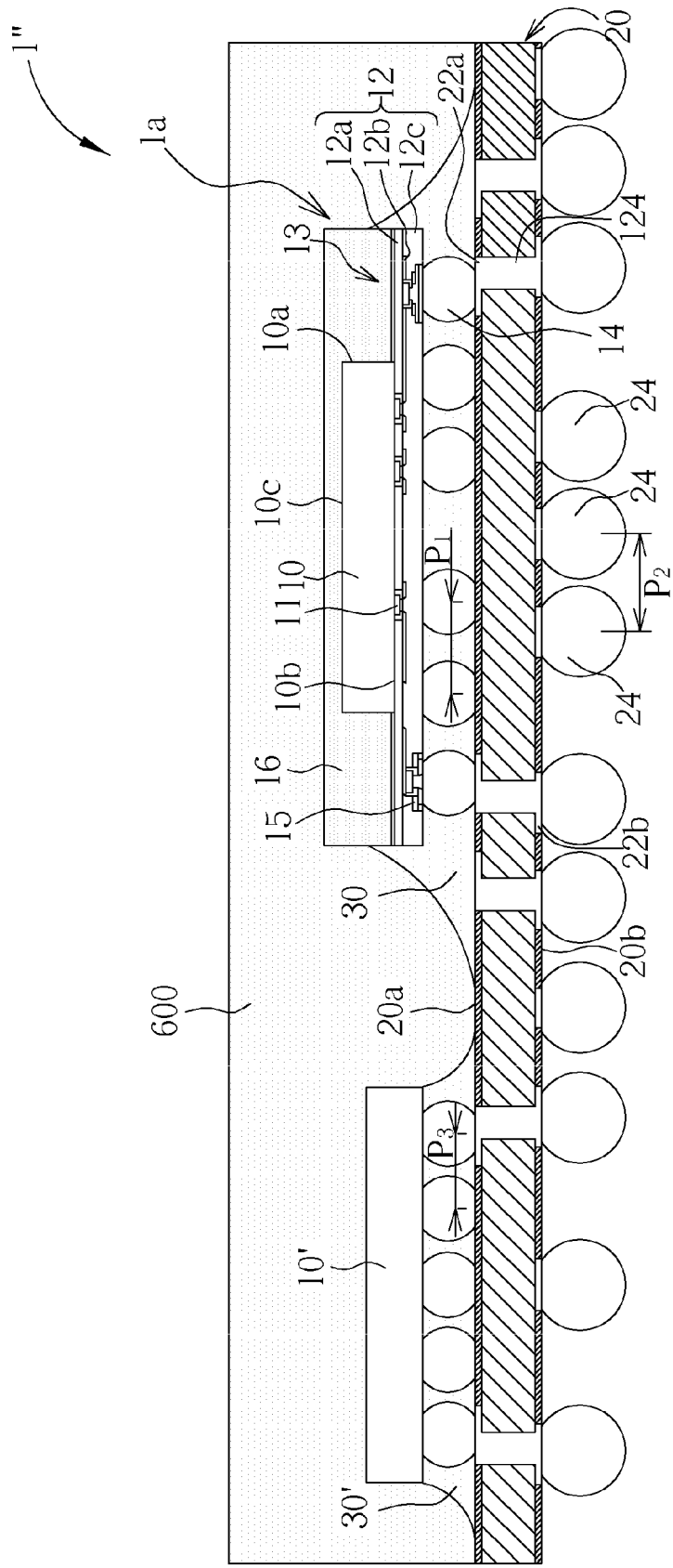
FIG. 14 is a schematic, cross-sectional diagram illustrating an SiP in accordance with yet another embodiment of this invention.

FIG. 14 is a schematic, cross-sectional diagram illustrating an SiP in accordance with yet another embodiment of this invention, wherein like numeral numbers designate like layers, elements or regions. As shown in FIG. 14, the SiP 1" may include all the features as set forth in FIG. 13. The difference between the SiP 1" of FIG. 14 and the SiP 1' of FIG. 13 is that in FIG. 14 a molding compound 600 encapsulates the fan-out WLP 1a, the semiconductor die 10', and partially the chip side 20a of the package carrier 20. The molding compound 600 surrounds and encompasses the mold cap 16 of the fan-out WLP 1a. It is noteworthy that the molding compound 600 and the mold cap 16 may be made of different materials.

Figure 15:
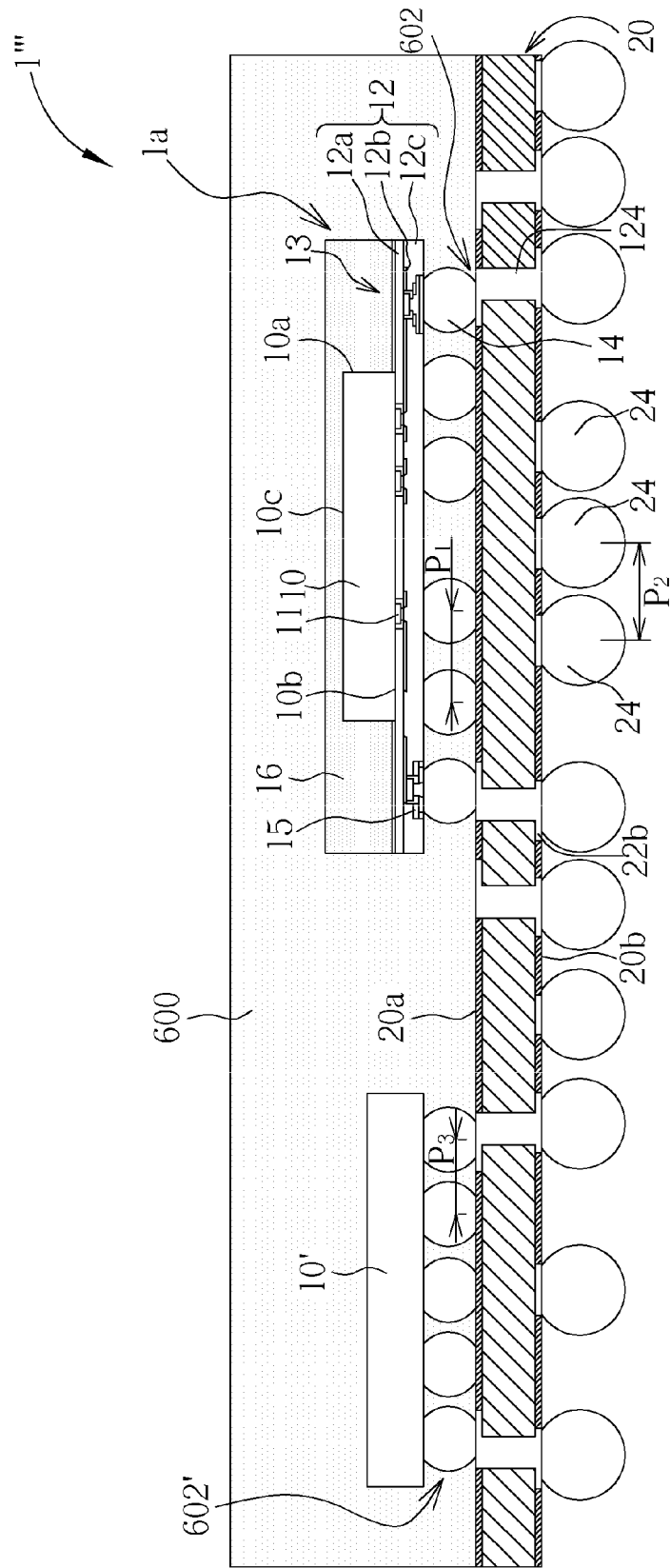
FIG. 15 is a schematic, cross-sectional diagram illustrating an SiP in accordance with yet another embodiment of this invention.

FIG. 15 is a schematic, cross-sectional diagram illustrating an SiP in accordance with yet another embodiment of this invention, wherein like numeral numbers designate like layers, elements or regions. As shown in FIG. 15, likewise, the SiP 1''' may include all the features as set forth in FIG. 14 except that the underfill 30 and 31 are spared. As the bump pitch $P_1$ of the solder bumps 14 is enlarged, the underfill 30 and 30' may be spared. The molding compound 600 encapsulates the fan-out WLP 1a and the semiconductor die 10', and fills into the gap 602 between the rewiring laminate structure 12 and the chip side 20a of the package carrier 20 and the gap 602' between the semiconductor die 10' and the chip side 20a of the package carrier 20.

Figure 16:
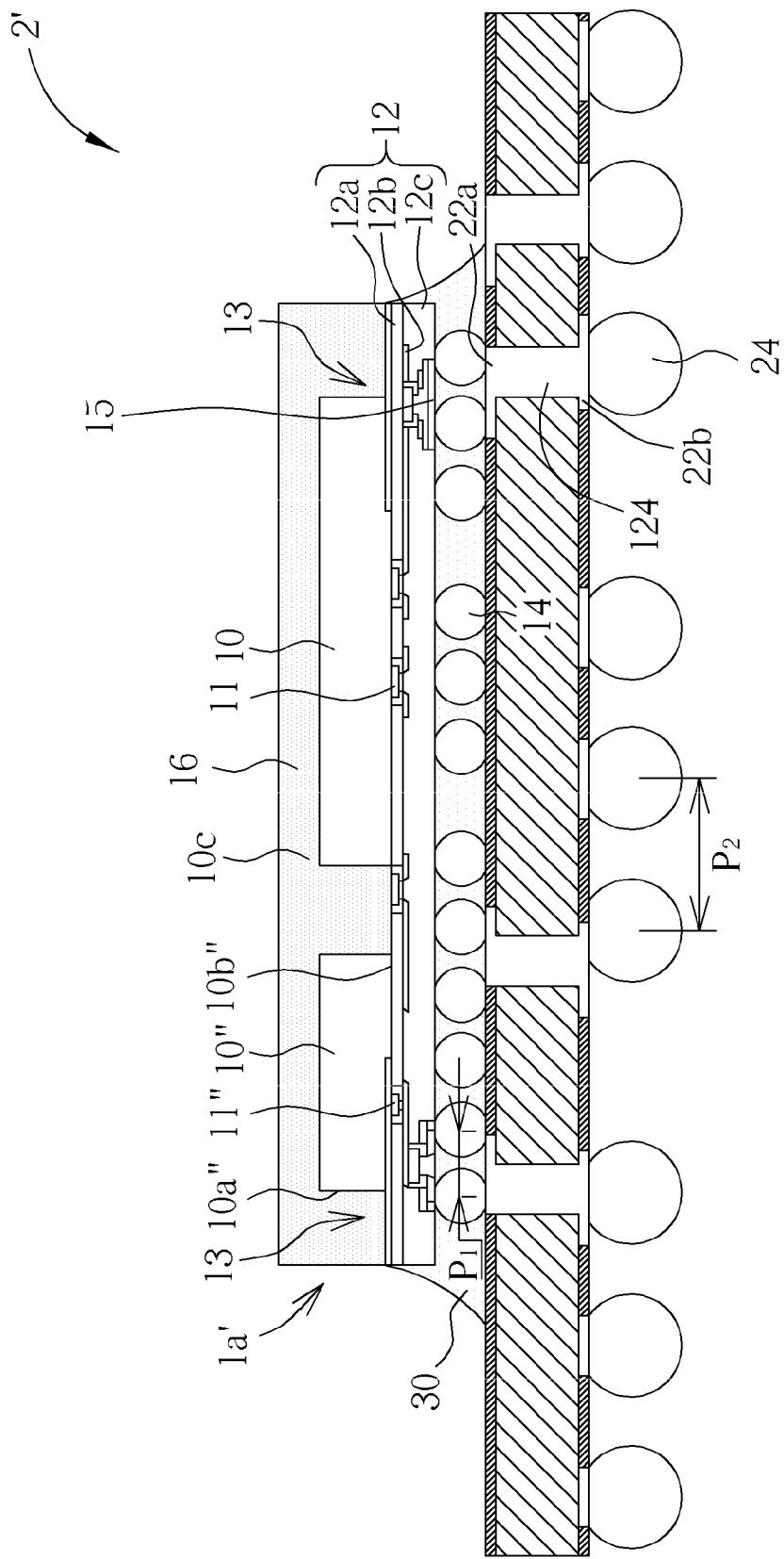
FIG. 16 is a schematic, cross-sectional diagram illustrating an SiP in accordance with yet another embodiment of this invention.

FIG. 16 is a schematic, cross-sectional diagram illustrating an SiP in accordance with yet another embodiment of this invention, wherein like numeral numbers designate like layers, elements or regions. As shown in FIG. 16, the SiP 2' comprises a fan-out WLP 1a' mounted on the chip side 20a of the package carrier 20. According to this embodiment, the fan-out WLP 1a' is a multi-chip module including but not limited to a semiconductor die 10 (or primary die) and a semiconductor die 10'' (or connectivity die), which are molded in one single package. The bond pads 11 or 11'' on each of the semiconductor die 10 and semiconductor die 10'' may be fan-out through the rewiring laminate structure 12 that is provided directly on the coplanar die faces of the semiconductor die 10 and the semiconductor die 10''. By way of example, the semiconductor die 10 may be a baseband chip or die, an RF chip or a SoC chip, while the semiconductor die 10'' may be a WiFi chip, FM chip, GPS chip or bluetooth chip. Likewise, a mold cap 16 encapsulates a portion of the semiconductor die 10, e.g. the whole surface except for the die face where the contact pads 11 are formed, and encapsulates a portion of the semiconductor die 10''. The rewiring laminate structure 12 has the same structure as previously described. According to the embodiment of this invention, the rewiring laminate structure 12 comprises an insulating layer 12a, a re-routed metal layer 12b and a solder resist layer 12c. At least a portion of the re-routed metal layer 12b as specifically indicated by numeral number 13 projects beyond the die edge 10a or 10a''. That is, the re-routed metal layer 12b laterally extends over a surface of the mold cap 16 that is substantially coplanar with the die face 10b and die face 10b'' where the contact pads 11 and 11'' are formed respectively.

The re-routed metal layer 12b redistributes the contact pads 11 or 11'' on the die face of the semiconductor die 10 or 10'' to form fan-out bond pads 15 on the insulating layer 12a, thereby overcoming the bump pitch limitation on the substrate. It is noteworthy that there may be different types and choices of the fan-out bond pads 15, which should not limit the scope of the invention. The term "on the insulating layer 12a" herein means that the fan-out bond pads 15 is disposed on a surface of the insulating layer 12a and, for example, is formed after the insulating layer 12a is deposited.

The semiconductor die 10 is electrically connected to the package carrier 20 through the re-routed metal layer 12b and the solder bumps 14 disposed on the fan-out bond pad 15 defined in the rewiring laminate structure 12. The solder bumps 14 may comprise eutectic (e.g. 63% Sn, 37% Pb) or high lead (e.g. 95% Pb, 5% Sn) or lead-free (e.g. 97.5% Sn, 2.5% Ag) compositions. According to the embodiments of this invention, the bump pitch $P_1$ of the solder bumps 14 is about 0.13-0.4 mm (130-400 μm), for example. On the opposite side 20b, a plurality of solder balls 24 are provided with a ball pitch $P_2$ of about 0.5 mm (500 μm), for example, with the PCB utilized in FCCSP.

There are many known processes for flip-chip bumping. Solder bumping may, for example, put underbump metallization (UBM) over the bond pad by sputtering, plating, or a similar means. This process of putting UBM removes the passivating oxide layer on the bond pad and defines the solder-wetted area. Solder may then be deposited over the UBM by a suitable method, e.g., evaporation, electroplating, screen-printing, or needle-depositing, etc. The solder bumped die 10 is attached to the package carrier 20 by a solder reflow process. Thereafter, the underfill 30 is added between the rewiring laminate structure 12 and the package carrier 20. The underfill 30 may be a specially engineered epoxy that fills the gap between the rewiring laminate structure 12 and the package carrier 20, surrounding the solder bumps 14. The package carrier 20 may be a package substrate with two metal wiring layers 22a and 22b disposed on the chip side 20a and on an opposite side 20b respectively. The metal wiring layers 22a and 22b are electrically interconnected to each other by means of plated through holes 124 that are formed in the package carrier 20 by mechanical drilling methods according to this embodiment. Further, it is understood that the package carrier 20 may have multiple metal wiring layers, for example, four layers or six layers.

Figure 17:
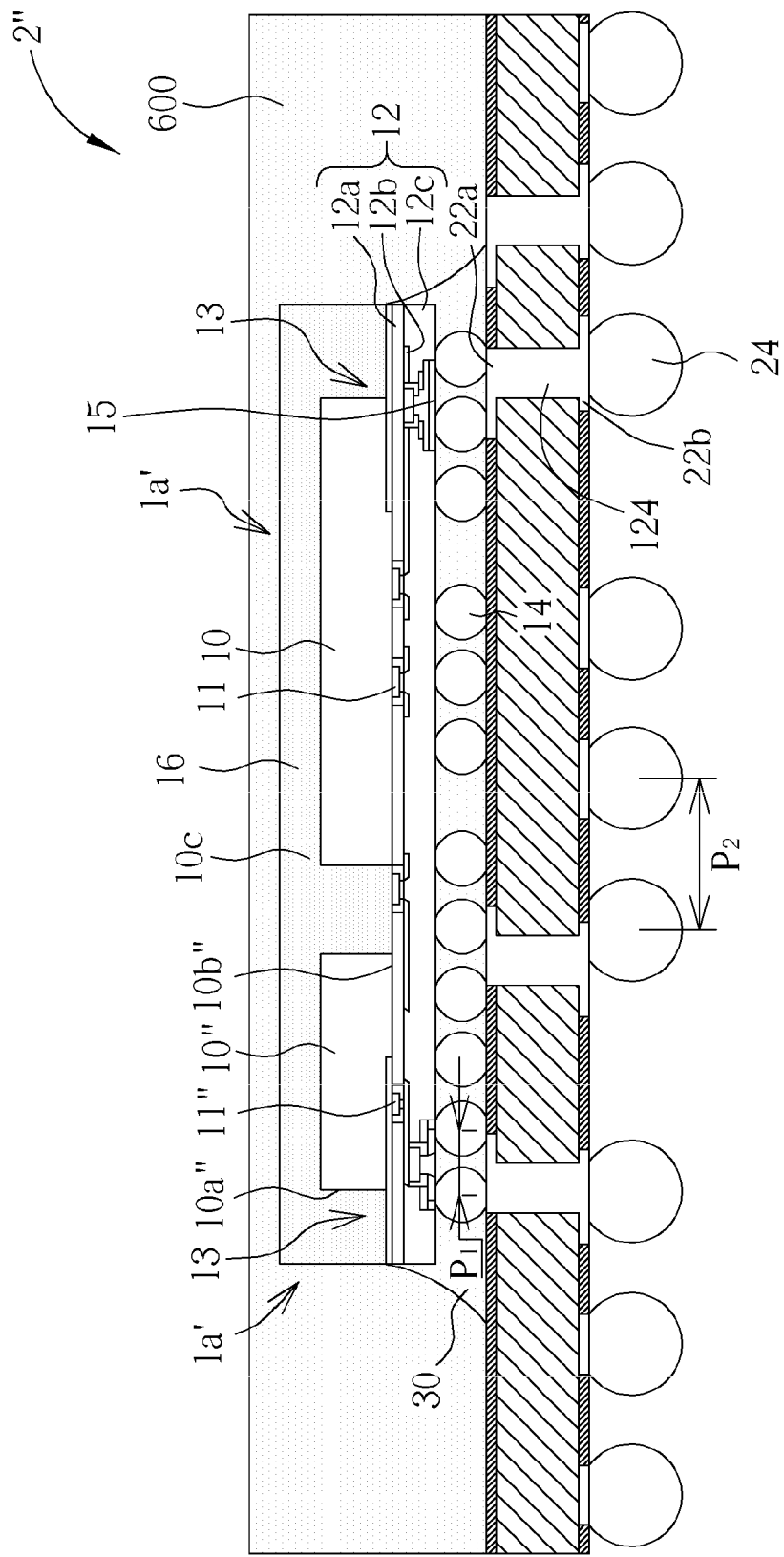
FIG. 17 is a schematic, cross-sectional diagram illustrating an SiP in accordance with yet another embodiment of this invention.

FIG. 17 is a schematic, cross-sectional diagram illustrating an SiP in accordance with yet another embodiment of this invention, wherein like numeral numbers designate like layers, elements or regions. As shown in FIG. 17, the SiP 2'' may include all the features as set forth in FIG. 16. The difference between the SiP 2'' of FIG. 17 and the SiP 2' of FIG. 16 is that in FIG. 17 a molding compound 600 encapsulates the fan-out WLP 1a' and partially the chip side 20a of the package carrier 20. It is noteworthy that the molding compound 600 and the mold cap 16 may be made of different materials.

Figure 18:
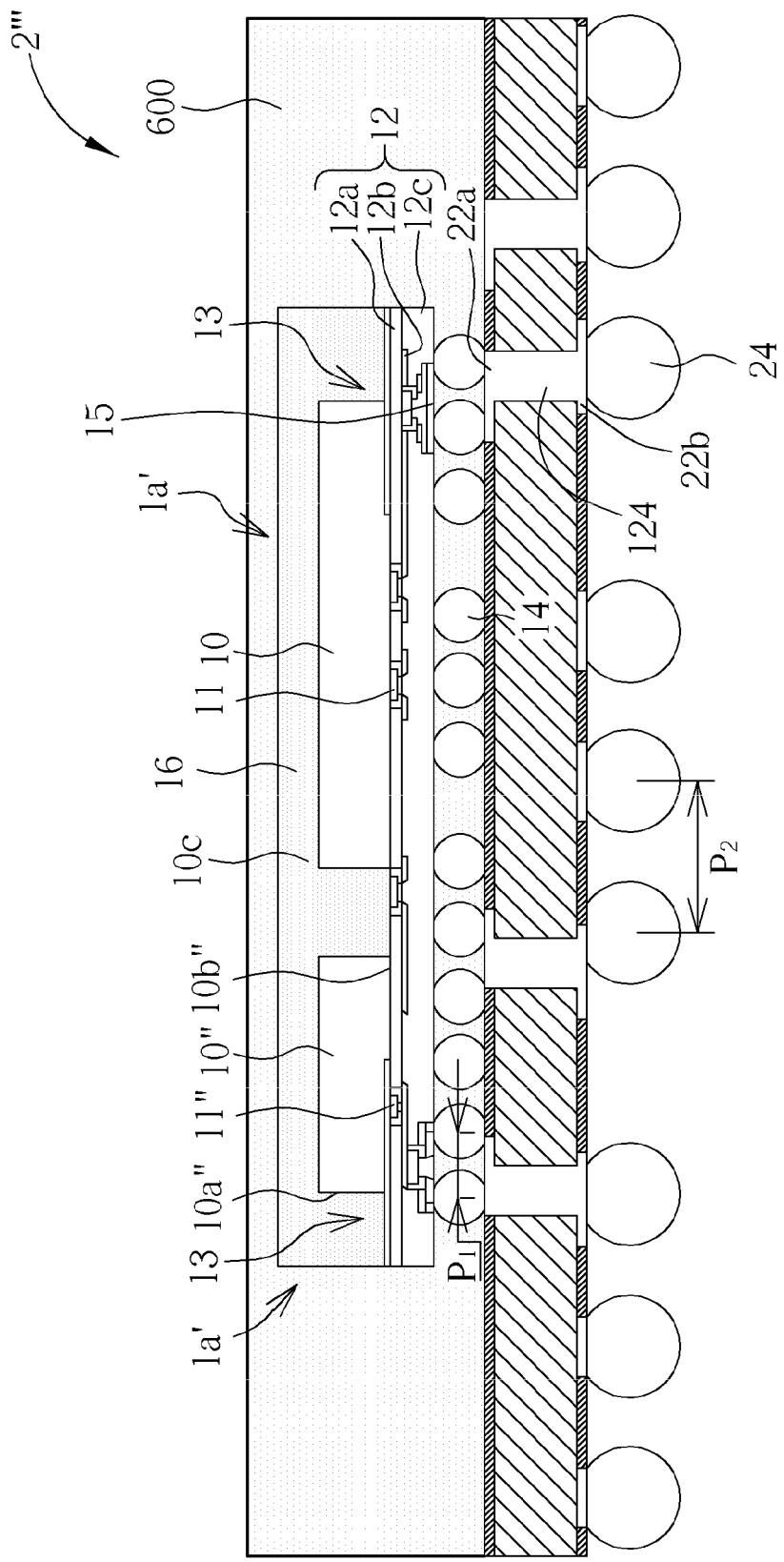
FIG. 18 is a schematic, cross-sectional diagram illustrating an SiP in accordance with yet another embodiment of this invention.

FIG. 18 is a schematic, cross-sectional diagram illustrating an SiP in accordance with yet another embodiment of this invention, wherein like numeral numbers designate like layers, elements or regions. As shown in FIG. 18, likewise, the SiP 2''' may include all the features as set forth in FIG. 17 except that the underfill 30 are spared. As the bump pitch $P_1$ of the solder bumps 14 is enlarged, the underfill 30 may be spared. The molding compound 600 encapsulates the fan-out WLP 1a', and fills into the gap 602 between the rewiring laminate structure 12 and the chip side 20a of the package carrier 20.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system-in-package, comprising:
   a package carrier;
   a first semiconductor die having a die face and a die edge, the first semiconductor die being assembled face-down to a chip side of the package carrier, wherein a plurality of contact pads are situated on the die face;
   a second semiconductor die mounted on the package carrier and adjacent to the first semiconductor die;
   a rewiring laminate structure between the first semiconductor die and the package carrier, the rewiring laminate structure comprising a re-routed metal layer, wherein at least a portion of the re-routed metal layer projects beyond the die edge; and
   a plurality of bumps arranged on the rewiring laminate structure for electrically connecting the first semiconductor die with the package carrier.

2. The system-in-package according to claim 1 further comprising an underfill between the rewiring laminate structure and the package carrier.

3. The system-in-package according to claim 1 wherein the package carrier is a substrate comprising two metal wiring layers disposed on the chip side and on an opposite side of the package carrier respectively.

4. The system-in-package according to claim 3 wherein the two metal wiring layers are electrically interconnected to each other by means of plated through holes that are formed in the package carrier by mechanical drilling methods.

5. The system-in-package according to claim 1 wherein the re-routed metal layer redistributes the contact pads on the die face of the first semiconductor die to form fan-out bond pads, and the plurality of bumps are arranged on the fan-out bond pads respectively.

6. The system-in-package according to claim 1 wherein the second semiconductor die has a contact/bond pad pitch that is substantially equal to a bump pitch applied between the second semiconductor die and the package carrier.

7. The system-in-package according to claim 1 wherein the first semiconductor die has a contact/bond pad pitch smaller than that of the second semiconductor die.

8. The system-in-package according to claim 1 further comprising a mold cap encapsulating at least a portion of the first semiconductor die.

9. The system-in-package according to claim 1 further comprising a molding compound encapsulating the first semiconductor die and the second semiconductor die.

10. The system-in-package according to claim 9 wherein the molding compound fills gaps between the first semiconductor die and the package substrate and between the second semiconductor die and the package substrate.

11. The system-in-package according to claim 1 wherein the first semiconductor die is a baseband chip, an RF chip or a SoC chip.

12. The system-in-package according to claim 11 wherein the second semiconductor die is a power-management IC (PMIC), a WiFi chip, an FM chip, a GPS chip or a bluetooth chip.

13. A system-in-package, comprising:
a package carrier having a chip side and an opposite side;
a fan-out wafer level device comprising a first semiconductor die mounted on the chip side of the package carrier;
a second semiconductor die mounted on the chip side of the package carrier and adjacent to the fan-out wafer level device and
an underfill between the package carrier and the fan-out wafer level device.

14. The system-in-package according to claim 13 wherein the fan-out wafer level device comprises:
a mold cap encapsulating at least a portion of the first semiconductor die; and
a redistribution layer for fan out contact pads of the first semiconductor die.

15. The system-in-package according to claim 13 wherein the package carrier is a substrate comprising two metal wiring layers disposed on the chip side and on the opposite side of the package carrier respectively.

16. The system-in-package according to claim 13 wherein the second semiconductor die has a contact/bond pad pitch that is substantially equal to a bump pitch applied between the second semiconductor die and the package carrier.

17. The system-in-package according to claim 13 wherein the first semiconductor die is a baseband chip, an RF chip or a SoC chip.

18. The system-in-package according to claim 17 wherein the second semiconductor die is a power-management IC (PMIC), a WiFi chip, an FM chip, a GPS chip or a bluetooth chip.

19. A system-in-package, comprising:
a package carrier having a chip side and an opposite side;
a fan-out wafer level device comprising a first semiconductor die mounted on the chip side of the package carrier;
a second semiconductor die mounted on the chip side of the package carrier and adjacent to the fan-out wafer level device; and
a molding compound encapsulating the fan-out wafer level device and the molding compound filling into a gap between the package carrier and the fan-out wafer level device.

20. The system-in-package according to claim 19 wherein the fan-out wafer level device comprises:
a mold cap encapsulating at least a portion of the first semiconductor die; and
a redistribution layer for fan out contact pads of the first semiconductor die.

21. The system-in-package according to claim 19 wherein the package carrier is a substrate comprising two metal wiring layers disposed on the chip side and on an opposite side of the package carrier respectively.

22. The system-in-package according to claim 19 wherein the second semiconductor die has a contact/bond pad pitch that is substantially equal to a bump pitch applied between the second semiconductor die and the package carrier.

23. The system-in-package according to claim 19 wherein the first semiconductor die is a baseband chip, an RF chip or a SoC chip.

24. The system-in-package according to claim 19 wherein the second semiconductor die is a power-management IC (PMIC), a WiFi chip, an FM chip, a GPS chip or a bluetooth chip.

25. A system-in-package, comprising:
a package carrier having a chip side and an opposite side;
a first semiconductor die having a die face and a die edge, the first semiconductor die being assembled face-down to the chip side of the package carrier, wherein a plurality of contact pads are situated on the die face;
a second semiconductor die mounted on the chip side of the package carrier and adjacent to the first semiconductor die;
a rewiring laminate structure between the first semiconductor die and the package carrier, the rewiring laminate structure comprising a re-routed metal layer, wherein at least a portion of the re-routed metal layer projects beyond the die edge;
a plurality of bumps arranged on the rewiring laminate structure for electrically connecting the first semiconductor die with the package carrier; and
a plurality of solder balls on the opposite side of the substrate.

26. The system-in-package according to claim 25 wherein the package carrier comprises two metal wiring layers disposed on the chip side and on the opposite side respectively, and wherein the two metal wiring layers are electrically interconnected to each other by means of plated through holes that are formed by mechanical drilling methods.

27. The system-in-package according to claim 25 further comprising an underfill between the rewiring laminate structure and the package carrier.

28. The system-in-package according to claim 25 wherein the second semiconductor die has a contact/bond pad pitch that is substantially equal to a bump pitch applied between the second semiconductor die and the package carrier.

29. The system-in-package according to claim 1 wherein the first semiconductor die and the second semiconductor die share the rewiring laminate structure.

30. The system-in-package according to claim 13 wherein the first semiconductor die and the second semiconductor die share a rewiring laminate structure of the fan-out wafer level device.

31. The system-in-package according to claim 19 wherein the first semiconductor die and the second semiconductor die share a rewiring laminate structure of the fan-out wafer level device.

32. The system-in-package according to claim 25 wherein the first semiconductor die and the second semiconductor die share the rewiring laminate structure.

* * * * *